(12) United States Patent
Andrews

(10) Patent No.: US 9,660,161 B2
(45) Date of Patent: May 23, 2017

(54) LIGHT EMITTING DIODE (LED) COMPONENTS INCLUDING CONTACT EXPANSION FRAME

(71) Applicant: Cree, Inc., Durham, NC (US)

(72) Inventor: Peter S. Andrews, Durham, NC (US)

(73) Assignee: Cree, Inc., Durham, NC (US)

( * ) Notice: Subject to any disclaimer, the term of this patent is extended or adjusted under 35 U.S.C. 154(b) by 336 days.

(21) Appl. No.: 14/325,047

(22) Filed: Jul. 7, 2014

(65) Prior Publication Data

US 2016/0005939 A1  Jan. 7, 2016

(51) Int. Cl.
| H01L 25/00 | (2006.01) |
| H01L 33/62 | (2010.01) |
| H01L 23/00 | (2006.01) |
| H01L 25/075 | (2006.01) |
| H01L 33/50 | (2010.01) |
| H01L 33/54 | (2010.01) |

(52) U.S. Cl.
CPC .............. *H01L 33/62* (2013.01); *H01L 24/97* (2013.01); *H01L 25/0753* (2013.01); *H01L 33/505* (2013.01); *H01L 33/54* (2013.01); *H01L 2224/16225* (2013.01); *H01L 2224/32014* (2013.01); *H01L 2224/32225* (2013.01); *H01L 2224/48091* (2013.01); *H01L 2224/48227* (2013.01); *H01L 2224/73265* (2013.01)

(58) Field of Classification Search
CPC ......... H01L 33/50; H01L 33/60; H01L 24/94; H01L 33/0079; H01L 33/0095; H01L 33/22; H01L 33/405; H01L 33/62; H01L 33/64
See application file for complete search history.

(56) References Cited

U.S. PATENT DOCUMENTS

| 7,009,199 B2 | 3/2006 | Hall | |
| 2009/0283787 A1* | 11/2009 | Donofrio | H01L 33/405 257/98 |
| 2011/0031502 A1 | 2/2011 | Bergmann et al. | |
| 2011/0084386 A1* | 4/2011 | Pendse | H01L 23/3178 257/737 |
| 2012/0138982 A1 | 6/2012 | Chen et al. | |
| 2012/0193660 A1 | 8/2012 | Donofrio et al. | |

(Continued)

OTHER PUBLICATIONS

Andrews et al. entitled "*Multiple Die Light Emitting Diode (LED) Components and Methods of Fabricating Same*", U.S. Appl. No. 14/289,305, filed May 28, 2014.

(Continued)

*Primary Examiner* — Caleb Henry
*Assistant Examiner* — Alexander Belousov
(74) *Attorney, Agent, or Firm* — Myers Bigel, P.A.

(57) ABSTRACT

A Light Emitting Diode (LED) component includes an LED die and a contact expansion frame having an expanded anode contact and/or an expanded cathode contact. A patterned solder mask is provided on the contact expansion frame that exposes a portion of the outer face of the expanded anode contact and/or a portion of the outer face of the expanded cathode contact. A solder layer is provided on the portion of the outer face of the expanded anode contact and on the portion of the outer face of the expanded cathode contact. Multiple die components and related fabrication methods are also described.

28 Claims, 19 Drawing Sheets

(56) References Cited

U.S. PATENT DOCUMENTS

| | | | |
|---|---|---|---|
| 2012/0193662 A1* | 8/2012 | Donofrio | H01L 33/60 257/98 |
| 2012/0267661 A1 | 10/2012 | Kim et al. | |
| 2013/0264589 A1 | 10/2013 | Bergmann et al. | |
| 2013/0264592 A1 | 10/2013 | Bergmann et al. | |
| 2014/0346547 A1 | 11/2014 | Park | |
| 2015/0028361 A1 | 1/2015 | Schlereth et al. | |
| 2015/0124455 A1* | 5/2015 | Tamura | F21K 9/30 362/293 |

OTHER PUBLICATIONS

Bhat et al. entitled "*Wafer Level Contact Pad Solder Bumping for Surface Mount Devices With Non-Planar Recessed Contacting Surfaces*", U.S. Appl. No. 14/152,829, filed Jan. 10, 2014.

Bhat et al. entitled "*Wafer Level Contact Pad Standoffs With Integrated Reflector*", U.S. Appl. No. 61/941,369, filed Feb. 14, 2014.

Bhat et al. entitled "*Wafer Level Contact Pad Standoffs With Integrated Reflector*", U.S. Appl. No. 14/201,490, filed Mar. 7, 2014.

Cree, Inc., "Direct Attach DA2432™ LEDs" (Data Sheet: CPR3FM Rev.-, 2011), 5 pp.

Cree, Inc., "Direct Attach DA1000™ LEDs" (Data Sheet: CPR3ES Rev. A, 2010), 5 pp.

Cree, Inc., "Direct Attach DA3547™ LEDs" (Data Sheet: CPR3EL Rev. D, 2010-2012), 5 pp.

Cree, Inc., "Cree® EZ290™ Gen II LEDs Data Sheet: CxxxEZ290-Sxx00-2" (Data Sheet: CPR3EJ, Rev-), 5 pp.

Cree, Inc., "Cree® EZ1000™ Gen II LEDs Data Sheet: CxxxEZ1000-Sxx000-2" (Data Sheet: CPR3EC, Rev A), 5 pp.

Cree, Inc., "Cree® EZ950™ Gen 3 LEDs Data Sheet: CxxxEZ950-Sxx000-3-x" (Data Sheet: CPR3FW, Rev-), 6 pp.

Donofrio et al. entitled "*Conformally Coated Light Emitting Devices and Methods for Providing the Same*", U.S. Appl. No. 13/017,845, filed Jan. 31, 2011.

Schott, Product Information Datasheet—"D 263 Thin Borosilicate Glass", Date Unknown, 2 pp.

\* cited by examiner

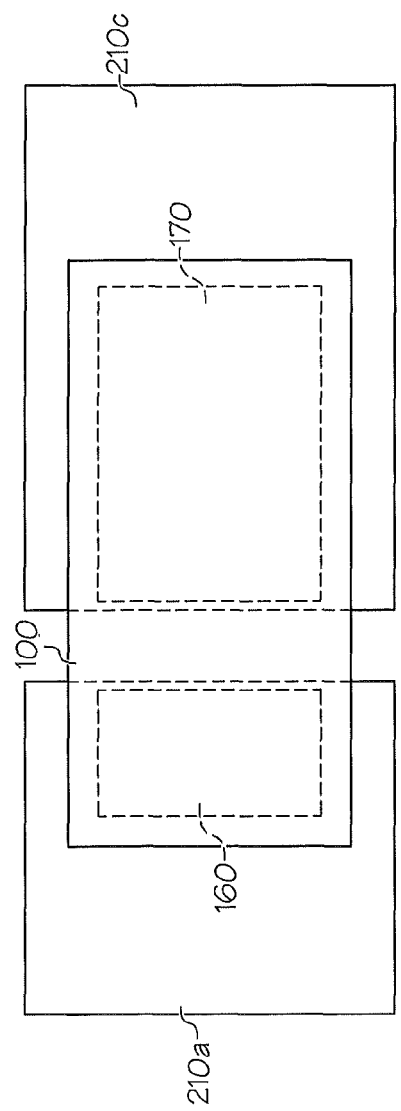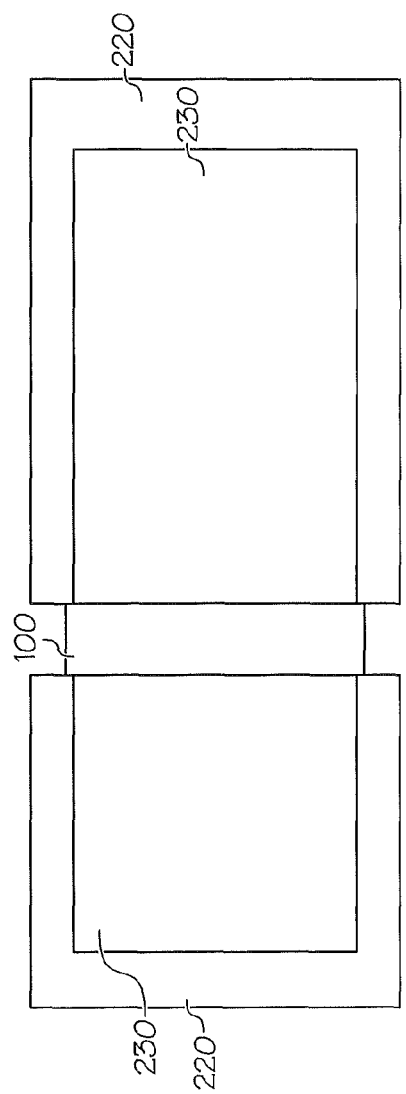

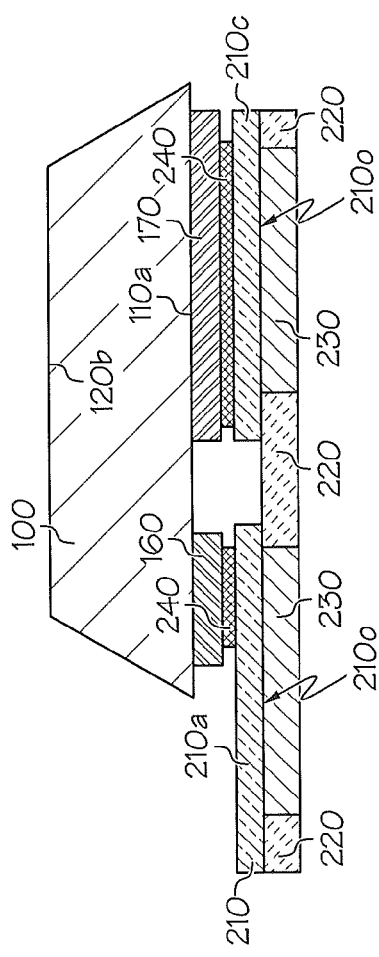
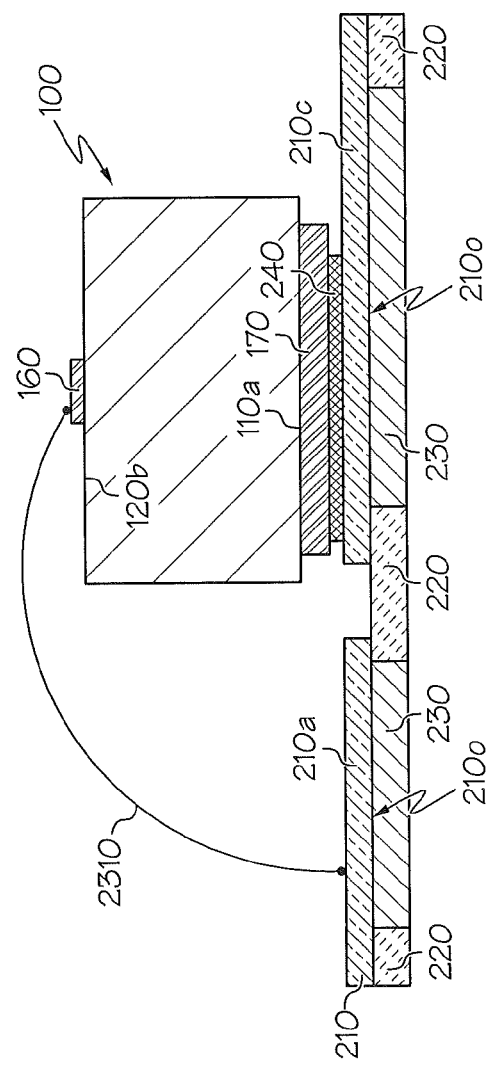

LIGHT EMITTING DIODE (LED) COMPONENTS INCLUDING CONTACT EXPANSION FRAME

BACKGROUND

Various embodiments described herein relate to light emitting devices and assemblies and methods of manufacturing the same, and more particularly, to Light Emitting Diodes (LEDs), assemblies thereof and fabrication methods therefor.

LEDs are widely known solid-state lighting elements that are capable of generating light upon application of voltage thereto. LEDs generally include a diode region having first and second opposing faces, and include therein an n-type layer, a p-type layer and a p-n junction. An anode contact ohmically contacts the p-type layer and a cathode contact ohmically contacts the n-type layer. The diode region may be epitaxially formed on a substrate, such as a sapphire, silicon, silicon carbide, gallium arsenide, gallium nitride, etc., growth substrate, but the completed device may not include a substrate. The diode region may be fabricated, for example, from silicon carbide, gallium nitride, gallium phosphide, aluminum nitride and/or gallium arsenide-based materials and/or from organic semiconductor-based materials. Finally, the light radiated by the LED may be in the visible or ultraviolet (UV) regions, and the LED may incorporate wavelength conversion material such as phosphor.

An LED component provides a packaged LED die for mounting on a board, such as a Metal Core Printed Circuit Board (MCPCB), flexible circuit board and/or other printed circuit board, along with other electronic components, for example using surface mount technology. An LED component generally includes an LED die, a submount and other packaging elements.

Submounts are generally used in LED components to interpose an LED die and a printed circuit board. The submount may change the contact configuration of the LED die to be compatible with the pads of the printed circuit board. The submount may also be used to support a phosphor layer and/or an encapsulating dome that surrounds the LED die. The submount may also provide other functionality. Thus, a submount may include a receiving element onto which an LED die is mounted using conventional die-attach techniques, to interface the LED die and a printed circuit board. A submount generally has a thickness of at least 100 µm, and in some embodiments at least 150 µm, and in other embodiments at least 200 µm, and generally includes traces (such as on ceramic panels) and/or leads (such as in Plastic Leaded Chip Carrier (PLCC) package).

LEDs are increasingly being used in lighting/illumination applications, with a goal being to provide a replacement for the ubiquitous incandescent light bulb.

SUMMARY

A Light Emitting Diode (LED) component according to various embodiments described herein includes an LED die that comprises first and second opposing faces and an anode contact and/or a cathode contact on the first face thereof, the anode and cathode contacts including outer faces remote from the LED die. A contact expansion frame is provided that comprises an expanded anode contact that is electrically connected to the anode contact remote from the LED die and/or an expanded cathode contact that is electrically connected to the cathode contact remote from the LED die, the expanded anode contact extending along the outer face of the anode contact and beyond the anode contact, the expanded cathode contact extending along the outer face of the cathode contact and beyond the cathode contact, the expanded anode and cathode contacts including outer faces remote from the anode and cathode contacts. The expanded anode and cathode contacts may be of the same size and shape or may be of different size and/or shape. A patterned solder mask is provided on the contact expansion frame remote from the anode and cathode contacts that exposes a portion of the outer face of the expanded anode contact and/or a portion of the outer face of the expanded cathode contact. A solder layer is provided on the exposed portion of the outer face of the expanded anode contact and/or on the exposed portion of the outer face of the expanded cathode contact.

In some embodiments the patterned solder mask comprises reflective material and in other embodiments may comprise white paint. Moreover, in some embodiments a solder layer is also used to electrically connect the expanded anode contact to the anode contact remote from the LED die and to electrically connect the expanded cathode contact to the cathode contact remote from the LED die. In other embodiments, a first wire bond electrically connects the anode contact to the expanded anode contact and/or a second wire bond electrically connects the cathode contact to the expanded cathode contact. Moreover, in some embodiments, the anode contact and the cathode contact are on the first face of the LED die, whereas in other embodiments only one of the anode contact or the cathode contact is on the first face of the LED die.

In some embodiments, the contact expansion frame further comprises a first tab that extends away from the expanded anode contact and/or a second tab that extends away from the expanded cathode contact, the respective first and second tabs forming respective unitary conductive structures with the respective expanded anode contact and expanded cathode contact. In other embodiments the contact frame further comprises three first tabs that extend away from the expanded anode contact and/or three second tabs that extend away from the expanded cathode contact, the three first tabs forming a unitary conductive structure with the expanded anode contact and the three second tabs forming a unitary conductive structure with the expanded cathode contact.

In some embodiments the LED component may further comprise a layer comprising luminophoric material on the second face of the LED die and extending onto sidewalls of the LED die and onto inner faces of the expanded anode and cathode contacts that are opposite the outer faces thereof. The LED component may further comprise an optically transparent structure on the layer comprising luminophoric material, remote from the LED die. Moreover, in some embodiments, an encapsulating structure may be provided on the LED die and on the contact expansion frame that does not extend on the outer face of the expanded anode contact or on the outer face of the expanded cathode contact.

In any of the above embodiments the LED component may be provided on a board along with other electronic components, wherein the LED component is free of a submount between the LED die and the board.

Multi-die components may also be provided according to various other embodiments described herein. Thus, an LED component may include a first LED die that comprises first and second opposing faces and a first anode contact and a first cathode contact on the first face thereof, the first anode and cathode contacts including outer faces remote from the first LED die; and a second LED die that comprises first and second opposing faces and a second anode contact and a second cathode contact on the first face thereof, the second anode and cathode contacts including outer faces remote from the second LED die.

A contact expansion frame may be provided that comprises a first expanded anode contact that is electrically connected to the first anode contact remote from the first LED die and a first expanded cathode contact that is electrically connected to the first cathode contact remote from the first LED die, the first expanded anode contact extending along the outer face of the first anode contact and beyond the first anode contact, the first expanded cathode contact extending along the outer face of the first cathode contact and beyond the first cathode contact, the first expanded anode and cathode contacts including outer faces remote from the first anode and cathode contacts. The contact expansion frame may further comprise a second expanded anode contact that is electrically connected to the second anode contact remote from the second LED die and a second expanded cathode contact that is electrically connected to the second cathode contact remote from the second LED die, the second expanded anode contact extending along the outer face of the second anode contact and beyond the second anode contact, the second expanded cathode contact extending along the outer face of the second cathode contact and beyond the second cathode contact, the second expanded anode and cathode contacts including outer faces remote from the second anode and cathode contacts. The contact expansion frame may still further comprise a linking portion that electrically connects the first expanded cathode contact to the second expanded anode contact or to the second expanded cathode contact, the linking portion forming a unitary conductive structure with the first expanded cathode contact and the second expanded anode contact or the second expanded cathode contact that are connected by the linking portion.

A patterned solder mask may also be provided on the contact expansion frame remote from the anode and cathode contacts, that exposes a portion of the outer face of the first and/or second expanded anode contacts and a portion of the outer faces of the first and/or second expanded cathode contacts. Finally a solder layer may be provided on the portion of the outer faces of the first and/or second expanded anode contacts and/or on the portion of the outer faces of the first and/or second expanded cathode contacts.

In some embodiments the linking portion electrically connects the first expanded cathode contact to the second expanded anode contact so as to connect the first and second LED dies in series. In other embodiments the linking portion electrically connects the first expanded anode contact to the second expanded anode contact and electrically connects the first expanded cathode contact to the second expanded cathode contact so as to connect the first and second LED dies in parallel.

In other embodiments the contact expansion frame may further comprise a first tab that extends away from the first expanded anode contact and a second tab that extends away from the second expanded cathode or anode contacts, the respective first and second tabs forming respective unitary conductive structures with the respective first expanded anode contact and second expanded cathode or anode contacts. In yet other embodiments the contact expansion frame further comprises three first tabs that extend away from the first expanded anode contact and three second tabs that extend away from the second expanded cathode or anode contacts, the three first tabs forming a unitary conductive structure with the first expanded anode contact and the three second tabs forming a unitary conductive structure with the second expanded cathode or anode contacts.

Any of the above embodiments may also provide a reflective solder mask that may comprise reflective material such as white paint; a solder layer that electrically connects the expanded anode contact to an anode contact and an expanded cathode contact to a cathode contact; a layer comprising luminophoric material; an optically transparent structure and/or mounting on a board as was described above.

LED components may be fabricated according to various embodiments described herein by electrically connecting a plurality of discrete LED dies to an expansion frame. The discrete LED dies comprise first and second opposing faces and an anode contact and a cathode contact on the first face thereof, the anode and cathode contacts including outer faces remote from the LED dies. The expansion frame comprises an array of pairs of closely spaced apart expanded anode contacts and expanded cathode contacts and a linking portion that selectively electrically connects the expanded anode and/or cathode contacts of adjacent pairs to one another. The electrical connection between the plurality of discrete LED dies and the expansion frame is made such that a respective anode contact of a respective LED die faces and is electrically connected to a respective expanded anode contact of a respective closely spaced apart pair and a respective cathode contact of a respective LED die faces and is electrically connected to a respective expanded cathode contact of the respective closely spaced apart pair. Moreover, a respective expanded anode contact extends along the outer face of the respective anode contact and beyond the respective anode contact, and a respective expanded cathode contact extends along the outer face of the respective cathode contact and beyond the respective cathode contact. The respective expanded anode and cathode contacts include outer faces remote from the respective anode and cathode contacts. A patterned solder mask is formed on the expansion frame remote from the anode and cathode contacts that exposes a portion of the respective outer faces of the respective expanded anode contacts and a portion of the respective outer faces of the respective expanded cathode contacts. A solder layer is formed on the portions of the outer face of the expanded anode contacts and on the portions of the outer face of the expanded cathode contacts. At least some of the linking portions are then severed to singulate the plurality of LED components.

In some embodiments the severing comprises severing at least some of the linking portions to singulate the plurality of LED components, at least one of which comprises a plurality of the LED dies that are connected in series and/or in parallel by the linking portions. In some embodiments the linking portion electrically connects a given expanded anode contact that is connected to a given LED die to an expanded anode contact that is connected to a first LED die on a first side of the given expanded anode contact, to an expanded anode contact that is connected to a second LED die on a second side of the given expanded anode contact and to an expanded cathode contact that is connected to a third LED die on a third side of the given expanded anode contact, and further electrically connects a given expanded cathode contact that is connected to the given LED die to an expanded cathode contact that is connected to the first LED die on a first side of the given expanded cathode contact, to an expanded cathode contact that is connected to the second LED die on a second side of the given expanded cathode contact and to an expanded anode contact that is connected to a fourth LED die on a third side of the given expanded cathode contact.

In some of these embodiments the severing may comprise severing the linking portions that connect the given expanded anode contact that is connected to a given LED die to the expanded anode contact that is connected to the first LED die on the first side of the given expanded anode contact and to the expanded anode contact that is connected to the second LED die on the second side of the given expanded anode contact, that connects the given expanded cathode contact that is connected to the given LED die to the expanded cathode contact that is connected to the first LED die and to the expanded cathode contact that is connected to the second LED die on the second side of the given expanded anode contact, so as to connect the third, given and fourth LED dies in series. In other embodiments the severing comprises severing the linking portion that connects the given expanded anode contact to the expanded cathode contact that is connected to the third LED die, and that connects the given expanded cathode contact to the expanded anode contact that is connected to a fourth LED die, so as to connect the first, given and second LED dies in parallel.

In any of the above described method embodiments the electrically connecting a plurality of discrete LED dies to the expansion frame may comprise soldering the LED dies to the expansion frame. Moreover in any of the above described embodiments the forming of a patterned solder mask may be preceded by coating a layer comprising luminophoric material on the second faces of the LED dies and extending onto sidewalls of the LED dies and onto an inner face of the expansion frame that is adjacent the anode and cathode contacts. Moreover, the coating may be followed by forming optically transparent structures on the layer comprising luminophoric material, remote from the LED dies. Also, the singulating may be followed by soldering the solder layer to a board along with other electronic components without a submount between the solder layer and the board.

BRIEF DESCRIPTION OF THE DRAWINGS

FIG. 3 is a top plan view of an LED component of FIG. 2.

FIG. 4 is a bottom plan view of an LED component of FIG. 2.

FIGS. 22-24 are cross-sectional views of LED components according to various other embodiments described herein.

DETAILED DESCRIPTION

Figure 1:
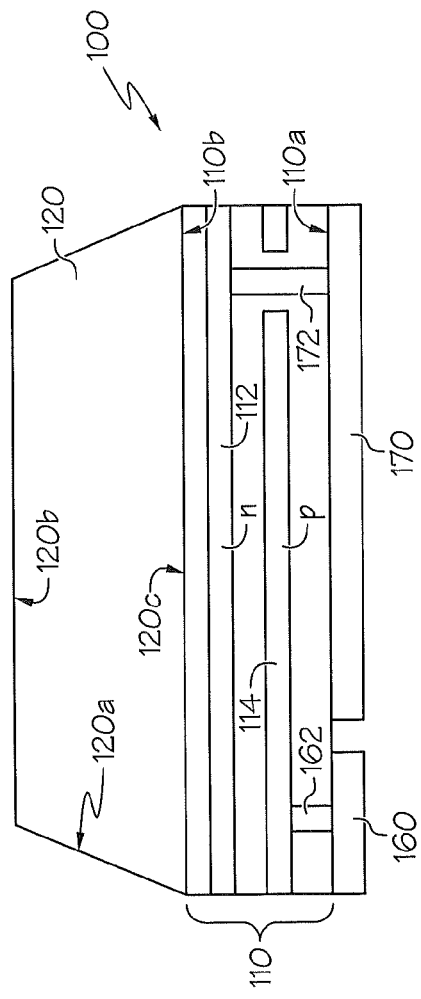
FIG. 1 is a cross-sectional view of an LED die according to various embodiments described herein.

The present invention now will be described more fully with reference to the accompanying drawings, in which various embodiments are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. The term "directly" means that there are no intervening elements. As used herein, the term "and/or" includes any and all combinations of one or more of the associated listed items and may be abbreviated as "/".

As used herein, a layer or region is considered to be "transparent" when at least 50% of the radiation that impinges on the transparent layer or region emerges through the transparent layer or region. Moreover, as used herein, a "rigid" structure is a stiff structure that is unable to bend or be forced out of shape; i.e., not flexible or pliant. A rigid structure may be subject to minimal bending without breaking, but bending beyond this minimal bending will break or deform a rigid structure. As also used herein, a "flexible structure" means a structure that is not rigid. In specific examples of materials used herein, glass is considered to be rigid, whereas silicone is considered to be flexible. Finally, as used herein, a "sheet" means a broad, relatively thin piece, plate or slab of material, such as glass.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional and/or other illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention, unless otherwise defined herein.

Unless otherwise defined herein, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Some embodiments now will be described generally with reference to gallium nitride (GaN)-based light emitting diodes on silicon carbide (SiC)-based growth substrates for ease of understanding the description herein. However, it will be understood by those having skill in the art that other embodiments of the present invention may be based on a variety of different combinations of growth substrate and epitaxial layers. For example, combinations can include AlGaInP diodes on GaP growth substrates; InGaAs diodes on GaAs growth substrates; AlGaAs diodes on GaAs growth substrates; SiC diodes on SiC or sapphire ($Al_2O_3$) growth substrates and/or a Group III-nitride-based diode on gallium nitride, silicon carbide, aluminum nitride, sapphire, zinc oxide and/or other growth substrates. Moreover, in other embodiments, a growth substrate may not be present in the finished product. For example, the growth substrate may be removed after forming the light emitting diode, and/or a bonded substrate may be provided on the light emitting diode after removing the growth substrate. In some embodiments, the light emitting diodes may be gallium nitride-based LED devices manufactured and sold by Cree, Inc. of Durham, N.C.

Some embodiments described herein can provide submount-free LED components that may be ready for mounting on a mounting board, such as a printed circuit board. The LED component includes one or more discrete LED dies and a contact expansion frame. The contact expansion frame may be configured to electrically connect the plurality of discrete LED dies in series and/or in parallel. The serial and/or parallel connection can provide high current and/or high voltage LED components, such as a 24 volt LED component. Moreover, the LED component is not supported by a submount.

Various embodiments described herein may arise from a recognition that, although useful for mounting LED dies, a submount may require additional processing complexity and/or cost, and may also impact the reliability of the LED component. In contrast, various embodiments described herein provide a contact expansion frame that can provide expanded anode and cathode contacts and can also electrically connect the plurality of discrete LED dies in series and/or in parallel, without a submount that spans adjacent ones of the LED dies. Moreover, multiple relatively small LED dies may be used in some embodiments, compared to one or more larger LED dies, which can increase luminous flux by providing additional light extraction surfaces (e.g., more sidewalls).

FIG. 1 is a cross-sectional view of a Light Emitting Diode (LED) die, also referred to as an LED chip, according to various embodiments described herein. Referring to FIG. 1, LED die 100 includes a diode region 110 having first and second opposing faces 110a, 110b, respectively, and including therein an n-type layer 112 and a p-type layer 114. Other layers or regions may be provided, which may include quantum wells, buffer layers, etc., that need not be described herein. An anode contact 160 ohmically contacts the p-type layer 114 and extends on the first face 110a. The anode contact 160 may directly ohmically contact the p-type layer 114, or may ohmically contact the p-type layer 114 by way of one or more conductive vias 162 and/or other intermediate layers. A cathode contact 170 ohmically contacts the n-type layer 112 and also extends on the first face 110a. The cathode contact may directly ohmically contact the n-type layer 112, or may ohmically contact the n-type layer 112 by way of one or more conductive vias 172 and/or other intermediate layers. As illustrated in FIG. 1, the anode contact 160 and that cathode contact 170 that both extend on the first face 110a are coplanar, although they need not be coplanar. The diode region 110 also may be referred to herein as an "LED epi region", because it is typically formed epitaxially on a substrate 120. For example, a Group III-nitride based LED epi region 110 may be formed on a silicon carbide growth substrate. In some embodiments, the growth substrate may be present in the finished product. In other embodiments, the growth substrate may be removed. In still other embodiments, another substrate may be provided that is different from the growth substrate.

As also shown in FIG. 1, a transparent substrate 120, such as a transparent silicon carbide growth substrate, is included on the second face 110b of the diode region 110. The transparent substrate 120 includes a sidewall 120a and may also include an inner face 120c adjacent the second face 110b of the diode region 110 and an outer face 120b, remote from the inner face 120c. The outer face 120b may be of smaller area than the inner face 120c. In some embodiments, the sidewall 120a may be stepped, beveled and/or faceted, so as to provide the outer face 120b that is of smaller area than the inner face 120c. In other embodiments, as shown in FIG. 1, the sidewall is an oblique sidewall 120a that extends at an oblique angle, and in some embodiments at an obtuse angle, from the outer face 120b towards the inner face 120c. In yet other embodiments, the sidewall 120a may be orthogonal to the faces.

LED dies 100 configured as was described above in connection with FIG. 1, may be referred to as "horizontal" or "lateral" LEDs, because both the anode and the cathode contacts thereof are provided on a single face of the LED die. Horizontal LEDs may be contrasted with vertical LEDs in which the anode and cathode contacts are provided on opposite faces thereof.

Various other configurations of horizontal LEDs that may be used according to any of the embodiments described herein, are described in detail in U.S. Patent Application Publication 2009/0283787 to Donofrio et al., entitled "Semiconductor Light Emitting Diodes Having Reflective Structures and Methods of Fabricating Same"; U.S. Patent Application Publication 2011/0031502 to Bergmann et al., entitled "Light Emitting Diodes Including Integrated Backside Reflector and Die Attach"; U.S. Patent Application Publication 2012/0193660 to Donofrio et al. entitled "Horizontal Light Emitting Diodes Including Phosphor Particles"; and U.S. Patent Application Publication 2012/0193662 to Donofrio et al. entitled "Reflective Mounting Substrates for Flip-Chip Mounted Horizontal LEDs", assigned to the assignee of the present application, the disclosures of which are hereby incorporated herein by reference in their entirety as if set forth fully herein.

Other configurations of horizontal LEDs may be embodied by the "Direct Attach" LED chips that are marketed by Cree, Inc., the assignee of the present application, and which are described, for example, in Data Sheets entitled "Direct Attach DA2432™ LEDs" (Data Sheet: CPR3FM Rev.-, 2011); "Direct Attach DA1000™ LEDs" (Data Sheet: CPR3ES Rev. A, 2010); and "Direct Attach DA3547™ LEDs" (Data Sheet: CPR3EL Rev. D, 2010-2012), the disclosures of which are hereby incorporated herein by reference in their entirety as if set forth fully herein.

Moreover, as will be described in detail below, various embodiments described herein may also be used with vertical LEDs, wherein the anode and cathode contacts are provided on opposite faces of an LED die. Vertical LEDs may be embodied by the EZ™ family of chips that are marketed by Cree, the assignee of the present application, and which are described, for example, in Data Sheets entitled "Cree® EZ290™ Gen II LEDs Data Sheet: CxxxEZ290-Sxx00-2" (Data Sheet: CPR3EJ, Rev-); "Cree® EZ1000™ Gen II LEDs Data Sheet: CxxxEZ1000-Sxx000-2" (Data Sheet: CPR3EC, Rev A); and "Cree® EZ950™ Gen 3 LEDs Data Sheet: CxxxEZ950-Sxx000-3-x" (Data Sheet: CPR3FW, Rev-), the disclosures of which are hereby incorporated herein by reference in their entirety as if set forth fully herein.

In order to simplify the drawings which follow, the internal structure of LED dies 100 will not be illustrated. Rather, the following figures will only illustrate the anode contact 160 and cathode contact 170 of the LED die 100. The LED die 100 comprises first and second opposing faces, wherein the first opposing face is the first face 110a of the diode region and the second face is the second face 110b of the diode region when no substrate is present, or the outer face 120b of the substrate 120 when a substrate 120 is present. The anode contact 160 and the cathode contact 170 are on the first face 110a.

Moreover, in various embodiments described herein, all of the LED dies 100 are indicated as being of the same size and generally rectangular. However, the LED dies 100 may be square or of other shapes, and need not all be the same size or type of LED. Moreover, the anode and cathode contacts 160 and 170, respectively, are all illustrated as being the same size as one another. In other embodiments, however, the anode and cathode contact of a given LED may be of the same size, and/or the anode and cathode contacts of the various LEDs need not be the same size or shape as one another. The LED dies may emit different colors of light and may include a phosphor layer thereon. For example, in some embodiments, a combination of white and red LED dies may be provided. Moreover, any number of multiple LED dies 100 may be provided based on the requirements of the LED component.

Figure 2:
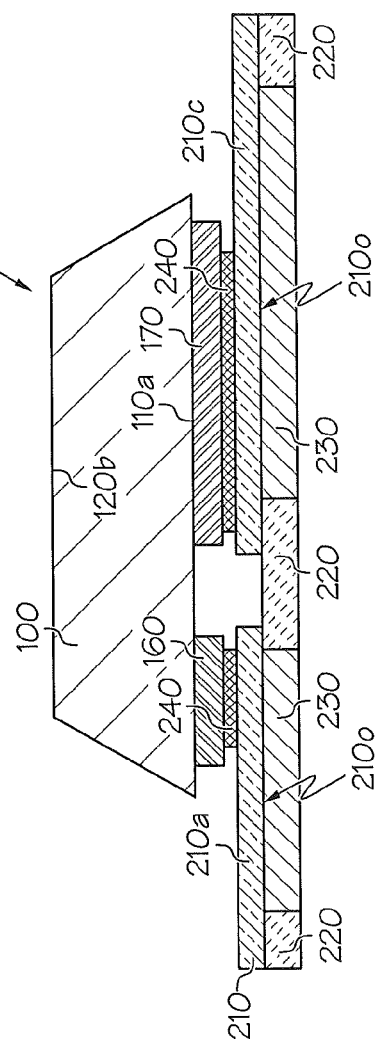
FIG. 2 is a cross-sectional view of an LED component according to various embodiments described herein.

FIG. 2 is a cross-sectional view of an LED component according to various embodiments described herein. Referring to FIG. 2 the LED component 200 includes a discrete LED die 100 that comprises first and second opposing faces 110a and 120b respectively, and an anode contact and a cathode contact 160, 170 respectively, on the first face 110a of the LED die 100. A contact expansion frame 210 is also provided that comprises an expanded anode contact 210a that is electrically connected to the anode contact 160 remote from the LED die 100 and an expanded cathode contact 210c that is electrically connected to the cathode contact 170 remote from the LED die 100. The expanded anode contact 210a extends along an outer face of the anode contact 160, i.e., the face of the anode contact 160 that is remote from the LED die 100, and also extends beyond the anode contact 160, i.e., beyond the periphery of the anode contact 160. The expanded cathode contact 210c extends along the outer face of the cathode contact 170, i.e., the face of the cathode contact 170 that is remote from the LED die 100, and also extends beyond the cathode contact 170, i.e., beyond the periphery of the cathode contact 170. The expanded anode and cathode contacts 210a and 210c include outer faces 210o remote from the anode and cathode contacts 160 and 170 respectively. A patterned solder mask 220 also is provided on the contact expansion frame 210 remote from the anode and cathode contacts 160 and 170. The patterned solder mask 220 exposes a portion of the outer face 210o of the expanded anode contact 210a and a portion of the outer face 210o of the expanded cathode contact 210c. A solder layer 230 is provided on the exposed portions of the outer face 210o of the expanded anode contact 210a and the expanded cathode contact 210c. Various embodiments of the contact expansion frame 210 will be described in detail below. Thus, as illustrated in FIG. 2, the contact expansion frame 210 may also be regarded as a "buried lead-frame" that is buried by the patterned solder mask 220 and the solder layer 230.

In some embodiments, the contact expansion frame 210 may comprise a patterned copper-based sheet that is about 100 μm thick in some embodiments, between about 50 μm and about 100 μm thick in other embodiments, and between about 100 μm and about 400 μm thick in still other embodiments. In some embodiments, the copper-based sheet may comprise copper, alloys of copper and/or copper with a solderable metal on the surface, such as electroless or electroplated silver plating, which may or may not include an intermediate layer, such as nickel. In other embodiments, the solderable metal may comprise tin, nickel/tin, SAC (Sn/Ag/Cu), lead/tin, gold/tin, gold and/or other solderable metal. Moreover, multilayer contact expansion frames 210 may be provided in still other embodiments that may include, for example, a core layer of aluminum and outer layers of copper-based materials and/or other materials.

The solder layer may include preforms, solder bumps, solder balls and/or any other solder structure that is used in microelectronic technology. More specifically, the solder layer 230 may comprise eutectic gold/tin solder, tin solder bump, solder paste and/or solder preform form, and may also include other solder compositions, such as lead/tin solders, tin/silver/copper solders, known as "SAC" solder and/or other solder configurations.

Accordingly, embodiments of FIG. 2 may provide larger and/or more spaced apart solder layers 230 that may be particularly suitable for Surface Mount Technology (SMT) assembly. As shown in FIG. 2 the solder layer 230 may be larger than and/or more spaced apart than the anode and cathode contacts 160 and 170 respectively, of the LED die 100. As also illustrated in FIG. 2, the LED component 200 is unsupported by a submount adjacent the first face 110a of the LED die 100.

Various techniques may be used to electrically connect the contact expansion frame 210 to the anode and cathode contacts 160 and 170, respectively, of the LED die 100. In FIG. 2 a second solder layer 240 is provided to electrically connect the inner faces of the expanded anode contact 210a and the expanded cathode contact 210c to the outer faces of the anode and cathode contacts 160 and 170 respectively. However, other techniques may also be used, such as thermo-compression bonding, conductive epoxy and/or pressure contact bonding using, for example, silver epoxy. Although the second solder layer 240 may have much smaller dimensions and/or more critical alignment requirements than the solder layer 230, the second solder layer 240 may be provided as part of a die manufacturing process in a semiconductor fabrication facility, where higher tolerances and smaller dimensions are well accommodated. In contrast, the connections of the solder layer 230 to a mounting board may be much larger and may have much less critical alignment tolerances, which may be handled well in SMT assembly plants.

The patterned solder mask 220 may comprise a reflective material, and in some embodiments may comprise white paint. The white paint may be applied, for example, by screen printing. Curing may be performed after application. Moreover, the solder layer 230 may comprise solder paste that is stenciled on the expanded anode contact 210a and the expanded cathode contact 210c, which then may be reflowed. In some embodiments, the reflective layer 220 may be about 40 µm thick and the solder layer 230 may be about 50 µm thick. Finally, it will be understood that although the patterned solder mask 220 is illustrated between the expanded anode contact 210a and the expanded cathode contact 210c, it need not be present in other embodiments. Stated differently, the central portion of the patterned solder mask 220 in FIG. 2 need not be present.

FIG. 3 is a top plan view of the LED component of FIG. 2 and illustrates how the expanded anode contact 210a and/or the expanded cathode contact 210c may extend beyond the respective anode contact 160 and/or the respective cathode contact 170 along multiple directions.

FIG. 4 is a bottom plan view of the LED component of FIG. 2 and illustrates that the patterned solder mask 220 need not completely encircle the solder layer 230 in order to be effective. Stated differently, in FIG. 4, the patterned solder mask only surrounds three sides of the solder layer 230. This can extend the size of all exposed portions of the expanded anode and/or cathode contacts which may increase yields. It will also be understood that although the periphery of the patterned solder mask 220 may be polygonal, the inner surface of the patterned solder mask 220 may be circular or elliptical to provide a circular solder layer or solder bump that is conventionally used in surface mount technologies.

It will be understood that in FIGS. 2-4 the expanded anode contact 210a and the expanded cathode contact 210c are of different sizes and shapes (square vs. rectangular). However in other embodiments the expanded anode and cathode contacts may be of the same shape and/or the same size.

It will also be understood that in FIGS. 2-4, an expanded anode contact 210a and an expanded cathode contact 210c are both provided. However, in other embodiments, an expanded anode contact 210a or an expanded cathode contact 210c may be provided. For example, referring to FIG. 22, only an expanded anode contact 210a is provided. The cathode contact 210c that is part of the contact expansion frame 210 need not be expanded relative to the cathode contact 170. Rather, it may be of the same size as shown in FIG. 22. Embodiments of FIG. 22 may be used, for example, when the cathode contact 170 is sufficiently large that it need not be expanded in order to be used with surface mount technology. It will also be understood that in other embodiments, an expanded anode contact need not be provided, but an expanded cathode contact may be provided.

Moreover, in still other embodiments, a contact expansion frame 210 may be used with a vertical LED, wherein only one of the anode contact or the cathode contact is on the first face 110a of the LED die 100. Thus, as illustrated in FIG. 23, an expanded cathode contact 210c may be used to expand the cathode contact 170 of a vertical LED die 100. An expanded anode contact 210a may also be provided, which may be connected to anode contact 160 on the second face 120b of the LED 100 using a wire bond 2310. In other embodiments, the positions of the anode contact 160 and cathode contact 170 may be reversed, so that a solder layer 240 is used to electrically connect the anode contact 160 to an expanded anode contact 210a and a wire bond 2310 is used to electrically connect the cathode contact 170 to an expanded cathode contact 210c.

Figure 24:
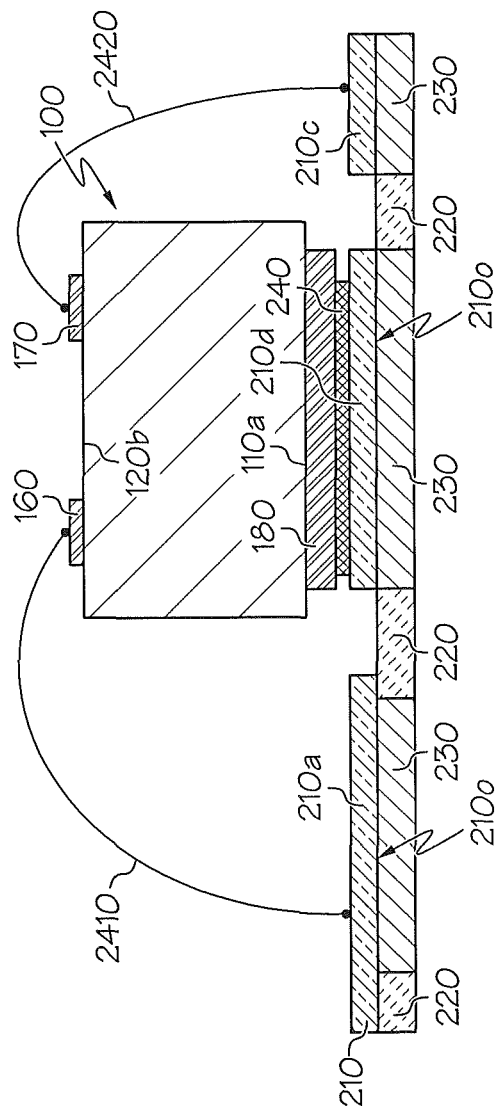

Finally, referring to FIG. 24, horizontal LEDs may also be used in various embodiments described herein when mounted in a "non-flip-chip" configuration. In these embodiments, a first wire bond 2410 may be used to electrically connect an anode contact 160 to an expanded anode contact 210a, and a second wire bond 2420 may be used to electrically connect a cathode contact 170 to an expanded cathode contact 210c. A neutral or thermal contact 180 of the LED may also be connected to a neutral or thermal portion 210d of the contact expansion frame 210. Embodiments of FIGS. 22-24 may be combined with one another and any of the other embodiments that will now be described.

Additional embodiments of a single die LED component will now be described. Specifically, referring to FIG. 5, a layer 510 comprising luminophoric material such as phosphor may be provided on the second face 120b of the LED die 100. Layer 510 may also extend onto sidewalls of the LED die 100 and onto inner faces of the expanded anode and cathode contacts 210a and 210c respectively that are opposite the outer faces 210o thereof. Moreover as illustrated in FIG. 5, an optically transparent structure 520 may be provided on the layer 510 comprising luminophoric material remote from the LED die 100.

Various embodiments of the luminophoric layer 510 and the optically transparent structure 520 may be provided according to various embodiments described herein. In some embodiments, a layer 510 including phosphor particles may be sprayed onto the LED die 100 to provide a conformal layer comprising luminophoric material that covers the exposed surfaces of the component. In some embodiments the optically transparent structure 520 may be fabricated by providing an encapsulation layer on the layer 510 comprising luminophoric material and then providing a glass sheet on the encapsulation layer remote from the layer 510 comprising luminophoric material. As illustrated in FIG. 5, in some embodiments, the encapsulation layer does not extend on the outer faces 210*o* of the expanded anode contact 210*a* or on the outer face 210*o* of the expanded cathode contact 210*c*. This contrasts with conventional encapsulation of lead frame-based LED components, wherein the encapsulation is also provided on the outer portion of the lead frame. An encapsulation layer with a glass sheet is described in detail in U.S. patent application Ser. No. 14/289,305 to Andrews et al. entitled "Multiple Die Light Emitting Diode (LED) Components and Methods of Fabricating Same", assigned to the Assignee of the present application, the disclosure of which is hereby incorporated herein by reference in its entirety as if set forth fully herein. In other embodiments a wafer or other structure that contains a large number of the LED components 200 thereon can be dammed at the periphery thereof and filled with silicone or other material and then cured. In still other embodiments injection molding may be used to mold a lens on the layer comprising luminophoric material 510. In yet other embodiments a lens may be dispensed by dispensing a drop (a glob) of liquid silicone on the individual LED component 200 (in wafer form or after singulation) which is then hardened to provide a lens 520. In any of these embodiments the layer 510 comprising luminophoric material may not be provided. In addition or alternatively, luminophoric material such as phosphor may also be included in the optically transparent structure 520.

Figure 6:
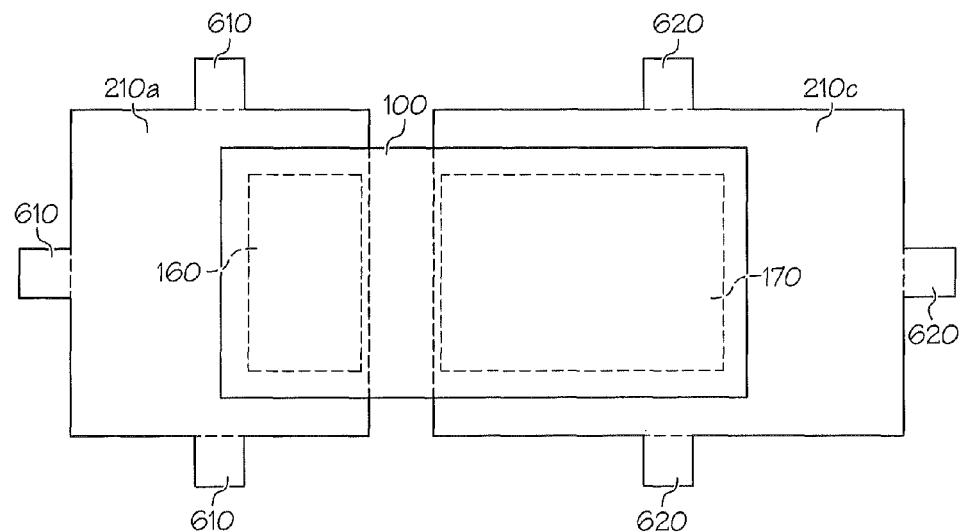
FIG. 6 is a top plan view of an LED component of FIG. 2 according to various other embodiments described herein.

FIG. 6 is a top plan view of an LED component according to other embodiments described herein and which may correspond to the top plan view of FIG. 2. However in FIG. 6, the contact expansion frame 210 further comprises at least one first tab 610 that extends away from the expanded anode contact 210*a* and at least one second tab 620 that extends away from the expanded cathode contact 210*c*. As shown by the dashed lines in FIG. 6, the respective first tab 610 and second tab 620 form a unitary conductive structure with the respective expanded anode contact 210*a* and expanded cathode contact 210*c*. As also shown in FIG. 6, three first tabs 610 and three second tabs 620 may be provided in some embodiments. The tabs 610 and/or 620 may be artifacts of the singulation process for the LED component 200 as will be described below and may also provide other functionality in the LED component 200.

Figure 5:
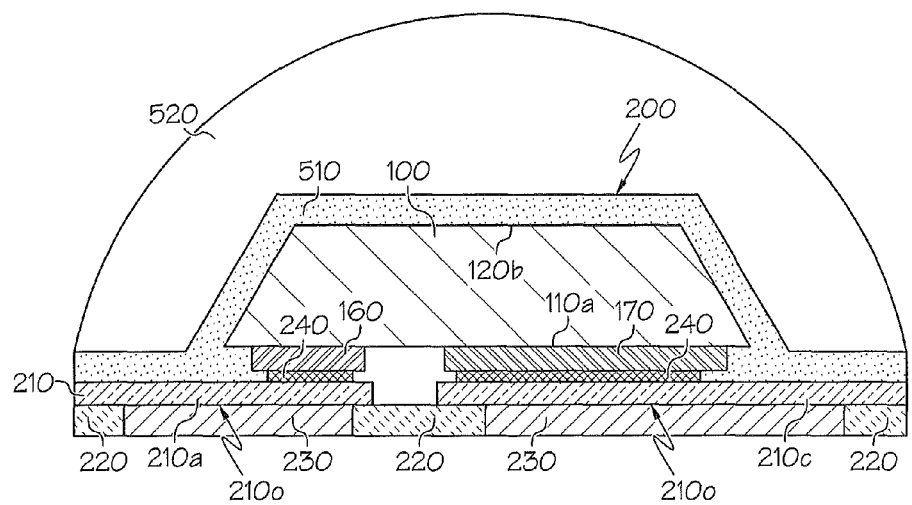
FIG. 5 is a cross-sectional view of an LED component according to various other embodiments described herein.
Figure 7:
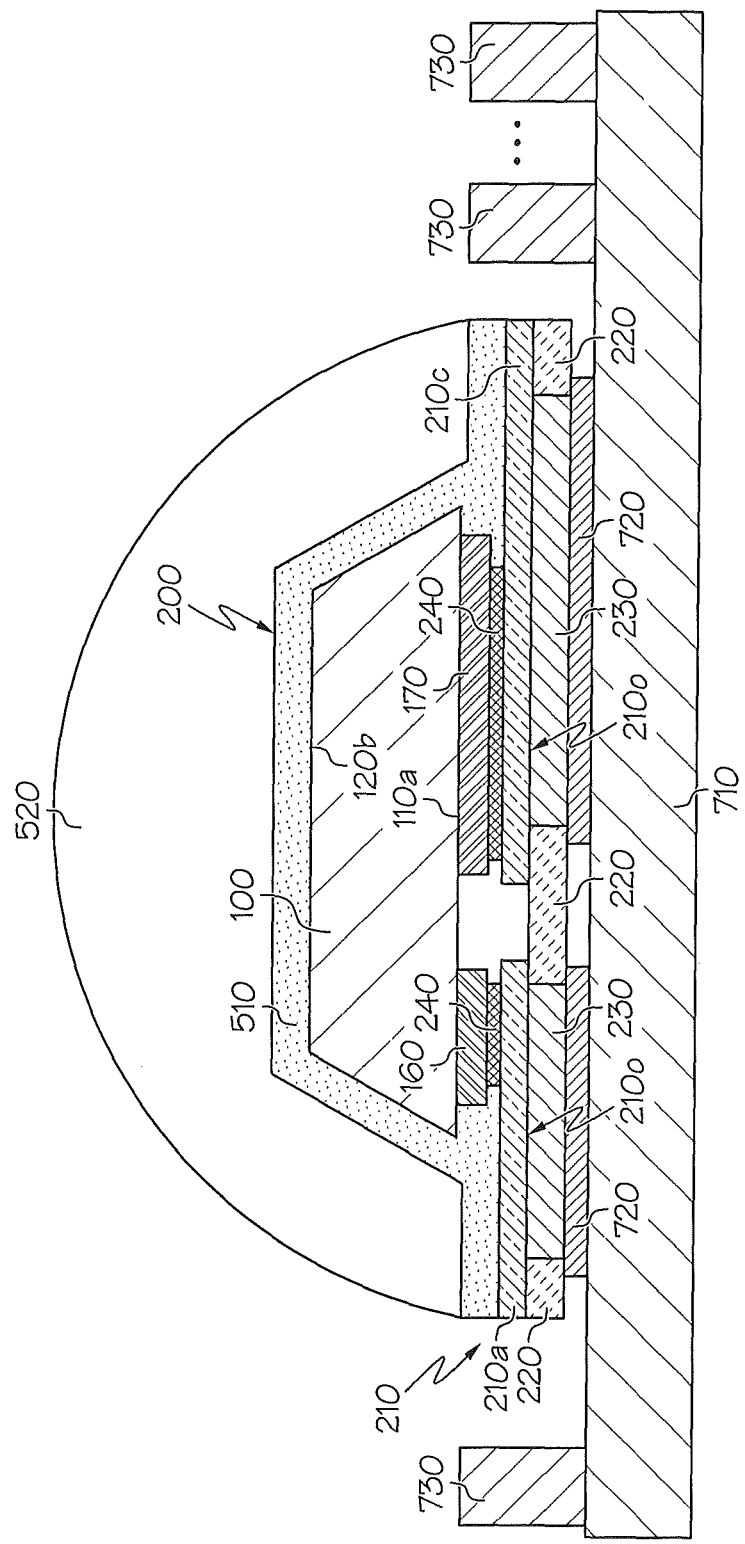
FIG. 7 is a cross-sectional view of an LED component of FIG. 5 mounted on a board according to various embodiments described herein.

FIG. 7 illustrates an LED component 200 of FIG. 5 on a board 710 along with other electronic components 730, wherein the LED component 200 is free of a submount between the LED die 100 and the board 710. The LED component 200 may be connected to the board 710 by soldering the expanded anode contact 210*a* and the expanded cathode contact 210*c* to pads 720 on the board 710 using the solder layer 230. The board 710 may comprise a printed circuit board, multilayered printed wiring board, flexible circuit board, etc.; and the pads 720 may be provided by metal traces that are on the surface of the board 710.

FIGS. 2-7 illustrated LED components that consist of a single LED die. However, various embodiments described herein may also provide submount-free multiple die LED components that may be ready for mounting on a mounting board, such as printed circuit board. The LED component includes a plurality of discrete LED dies and a contact expansion frame that is configured to electrically connect the plurality of discrete LED dies in series and/or in parallel. The serial and/or parallel connection can provide high current and/or high voltage LED components, such as a 24 volt LED component. Moreover, the LED component is not supported by a submount that spans the LED dies.

Various multiple die embodiments described herein may arise from a recognition that, although useful for mounting LED dies, a submount may require additional processing complexity and/or cost, and may also impact the reliability of the LED component. In contrast, various embodiments described herein provide a contact expansion frame that can provide expanded anode and cathode contacts and can also electrically connect the plurality of discrete LED dies in series and/or in parallel, without a submount that spans adjacent ones of the LED dies. Moreover, multiple relatively small LED dies may be used in some embodiments, compared to one or more larger LED dies, which can increase luminous flux by providing additional light extraction surfaces (e.g., more sidewalls).

Figure 8:
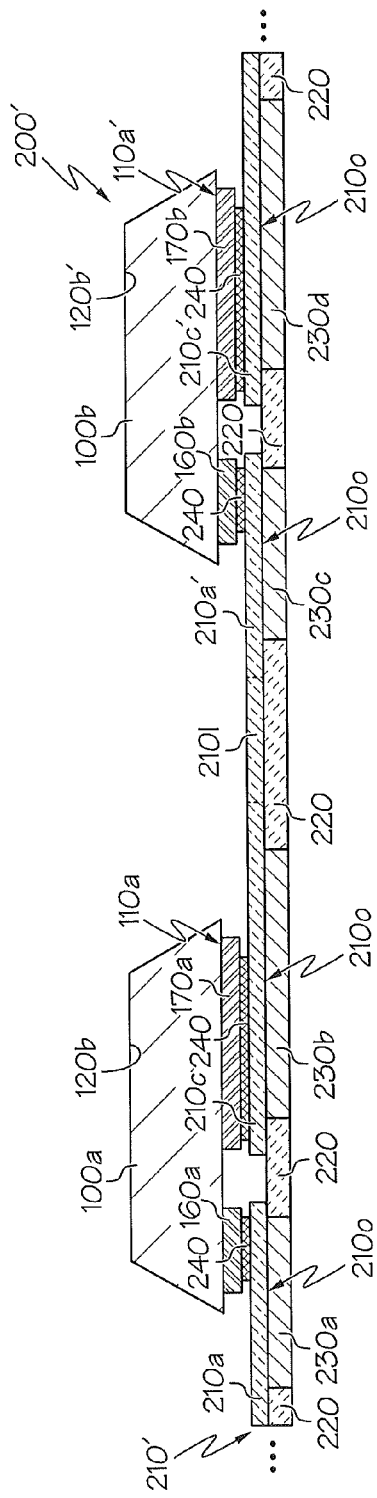
FIG. 8 is a cross-sectional view of a multiple die LED component according to various embodiments described herein.

FIG. 8 is a cross-sectional view of an LED component including multiple LED dies according to various embodiments described herein. Referring to FIG. 8, the LED component 200' includes a first LED die 100*a* that comprises first and second opposing faces 110*a*, 120*b* respectively, and a first anode contact 160*a* and a first cathode contact 170*a* on the first face 110*a* thereof. The first anode and cathode contacts 160*a*, 170*a* include outer faces remote from the first LED die 110*a*. A second LED die 110*b* also is provided that also comprises first and second opposing faces 110*a'* and 120*b'* respectively, and a second anode contact 160*b* and a second cathode contact 170*b* on the first face 110*a'* thereof. The second anode and cathode contacts 160*b*, 170*b* also include outer faces remote from the second LED die 100*b*.

A contact expansion frame 210' also is provided. The contact expansion frame 210' comprises a first expanded anode contact 210*a* that is electrically connected to the first anode contact 160*a* remote from the first LED die 100*a* and a first expanded cathode contact 210*c* that is electrically connected to the first cathode contact 170*a* remote from the LED die 110*a*. The first expanded anode contact 210*a* extends along the outer face of the first anode contact 160*a* and beyond the first anode contact 160*a*. The first expanded cathode contact 210*c* extends along the outer face of the first cathode contact 170*a* and beyond the first cathode contact 170*a*. The first expanded anode and cathode contacts 210*a*, 210*c* include outer faces 2100 remote from the first anode and cathode contacts 160*a*, 170*a*.

The contact expansion frame 210' also comprises a second expanded anode contact 210*a'* that is electrically connected to the second anode contact 160*b* remote from the second LED die 100*b* and a second expanded cathode contact 210*c'* that is electrically connected to the second cathode contact 170*b* remote from the second LED die 100*b*. The second expanded anode contact 210*a'* extends along the outer face of the second anode contact 160*b* and beyond the second anode contact 160*b*. The second expanded anode and cathode contacts 210*a'*, 210*c'* include outer faces 210*o* remote from the second anode and cathode contacts 210*a'*, 210*c'*.

Still referring to FIG. 8, the contact expansion frame 210' further includes a linking portion 2101 that electrically connects the first expanded cathode contact 210*c* to the second expanded anode contact 210*a'* (as illustrated in FIG. 8) or to the second expanded cathode contact 210*c'* (not illustrated in FIG. 8 but as will be described below). As also illustrated by the dashed lines, the linking portion 2101 forms a unitary conductive structure with the first expanded cathode contact 210c and the second expanded anode contact 210a' or the second expanded cathode contact 210c' that are connected by the linking portion 2101. As will be explained in more detail below the linking portion 2101 selectively connects anode and/or cathode contacts of adjacent LED dies to provide a series or parallel connection.

Continuing with the description of FIG. 8, a patterned solder mask 220 is provided on the contact expansion frame 210' remote from the anode and cathode contacts, that exposes a portion of the outer face 210o of the first and/or second expanded anode and/or cathode contacts. In FIG. 8 the outer face 210o of the first expanded anode contact 210a, of the first expanded cathode contact 210c, of the second expanded anode contact 210a' and of the second expanded cathode contact 210c' are all exposed. However, in other embodiments not all of these outer faces need be exposed. For example in some embodiments only the outer face 210o of the first expanded anode contact 210a and the second expanded cathode contact 210c' need be exposed to provide external connections for the LED component 200' as illustrated in FIG. 8.

Referring again to FIG. 8, a solder layer collectively referred to as 230 is provided. The solder layer may be embodied as a solder layer 230a on the portion of the outer face 210o of the first expanded anode contact 210a, a solder layer 230b on the outer face of the first expanded cathode contact 210c, a solder layer 230c on the outer face 210o of the second expanded anode contact 210a', and/or a solder layer 230d on the outer face 210o of the second expanded cathode contact 210c'. In some embodiments, when mounted on a board, the first and fourth layers 230a and 230d may provide an external anode connection and an external cathode connection for the LED component 210' and the second portion 230b and the third portion 230c may provide a thermal connection to the board that is not connected to other circuitry on the board.

Figure 9:
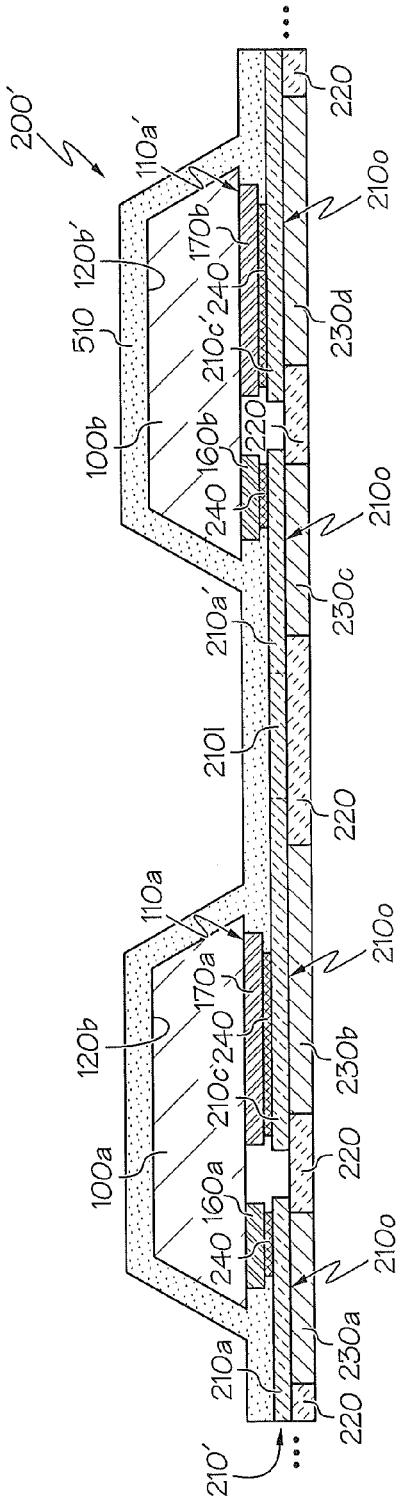
FIG. 9 is a cross-sectional view of a multiple die LED component according to various other embodiments described herein.

FIG. 9 illustrates the LED component of FIG. 8 with a layer 510 comprising luminophoric material thereon. In some embodiments the layer 510 need not extend over the linking portion 2101.

Figure 10:
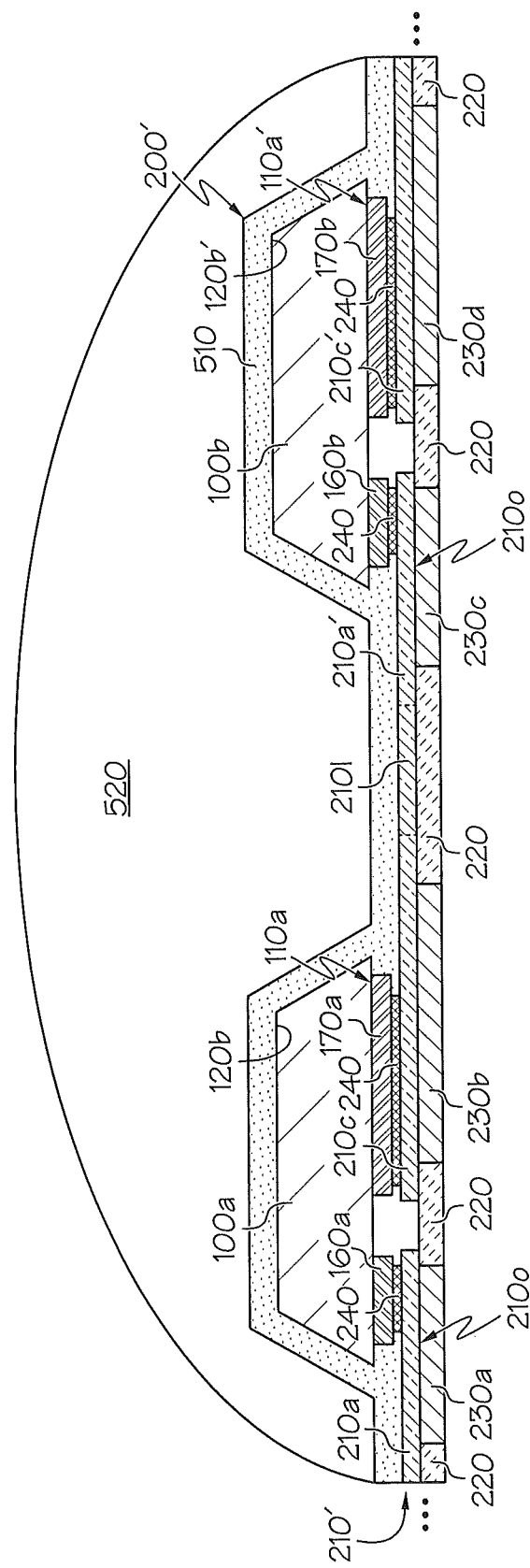
FIG. 10 is a cross-sectional view of a multiple die LED component according to yet other embodiments described herein.

FIG. 10 illustrates an LED component of FIG. 9 including a single optically transparent structure 520 that spans the LED dies 110a and 110b. An optically transparent structure according to any of the embodiments described herein may be provided.

Figure 11:
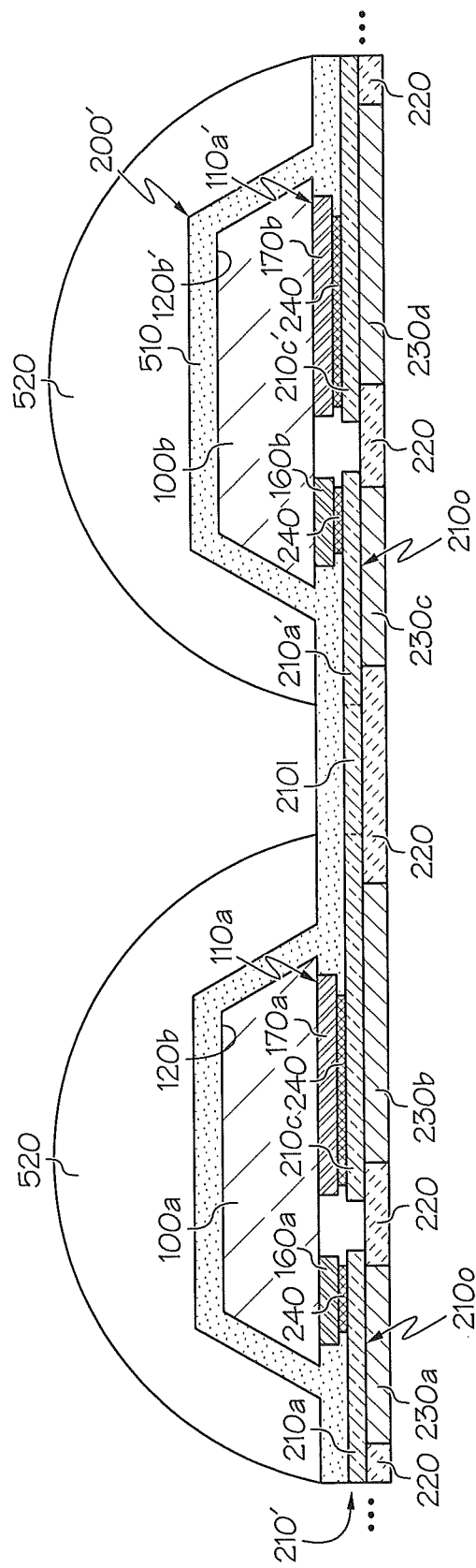
FIG. 11 is a cross-sectional view of a multiple die LED component according to still other embodiments described herein.

FIG. 11 illustrates another embodiment wherein a discrete optically transparent structure 520 is provided for each LED die. Although not shown in FIG. 11, in other embodiments the optically transparent structures 520 may contact one another and merge to provide additional rigidity to the device. Stated differently, a single lens may be provided for multiple LED dies in a component (FIG. 10) and/or an individual lens may be provided for an individual LED die (FIG. 11).

As was already described in connection with FIG. 9, the multiple die LED component may provide serial and/or parallel connection among the individual LED dies. For example as was illustrated in FIG. 9 the linking portion 2101 electrically connects the first expanded cathode contact 210c to the second expanded anode contact 210a' so as to connect the first and second LED dies in series. In other embodiments, the linking portion 2101 electrically connects the first expanded anode contact 210a to the second expanded anode contact 210a' and electrically connects the first expanded cathode contact 210c to the second expanded cathode contact 210c' so as to connect the first and second LED dies in parallel.

Figure 12:
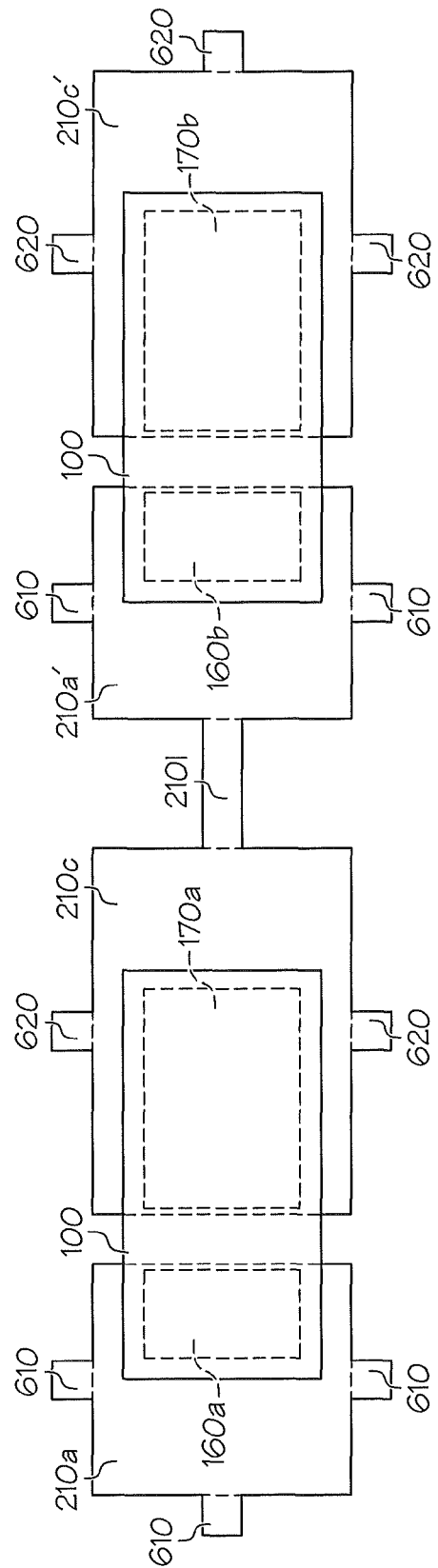
FIG. 12 is a top plan view of an LED component of FIG. 8.

Referring to FIG. 12, in any of the multi-die embodiments the contact expansion frame 210' may also include at least one first tab 610, and in some embodiments three first tabs 610, that extend away from the first expanded anode contact 210a and at least one tab 620, and in some embodiments three tabs 620, that extend away from the second expanded cathode contact 210c'. As will be described below in connection with FIGS. 15 and 16, the first and/or second tabs 610 and/or 620 may be artifacts of a linking portion 2101 after singulation. It will also be understood that not every expanded anode contact and not every expanded cathode contact need include at least one tab or need include three tabs, depending on the configuration.

Figure 13:
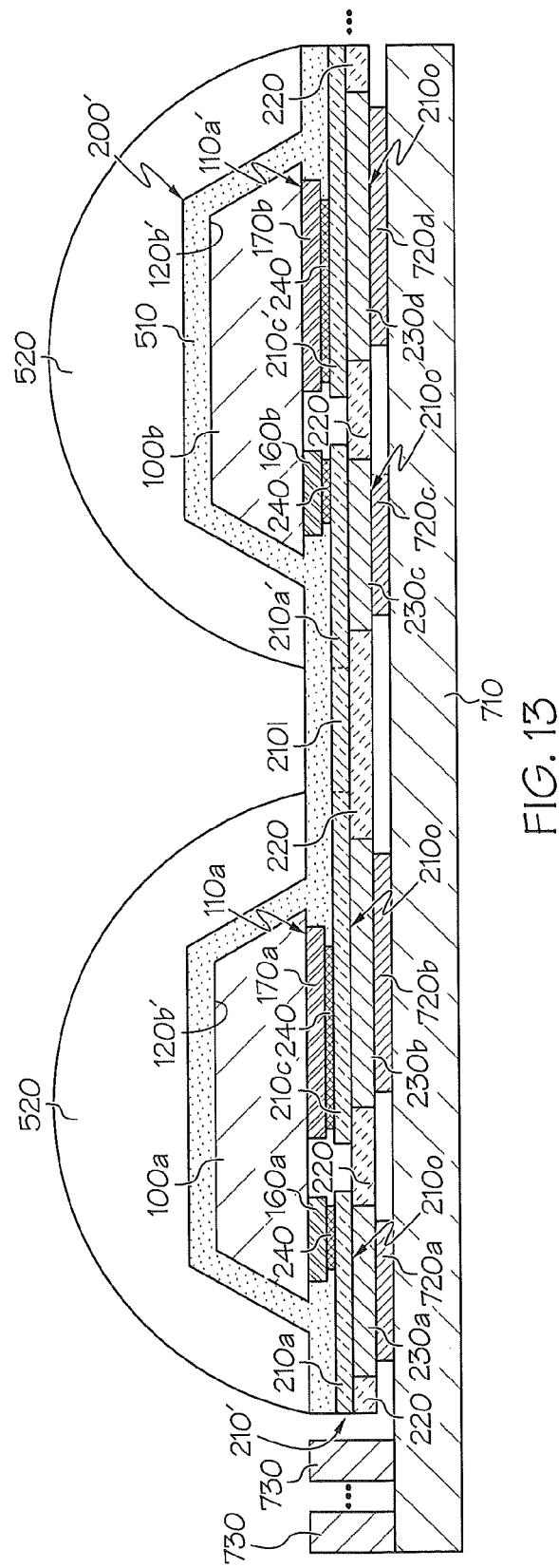
FIG. 13 is a cross-sectional view of an LED component of FIG. 11 mounted on a board according to various embodiments described herein.

FIG. 13 illustrates the multi-die LED component 200' of FIG. 11 mounted on a board 710 along with other electronic components 730. Pads 720a-720d on the board 710 may provide electrical connections to the LED component 200'. In the embodiment of FIG. 13, the pad 720a may provide an anode connection, the pad 720d may provide a cathode connection and the pads 720b and 720c may provide a thermal connection that is not connected to other circuitry in or on the board 710.

Figure 14:
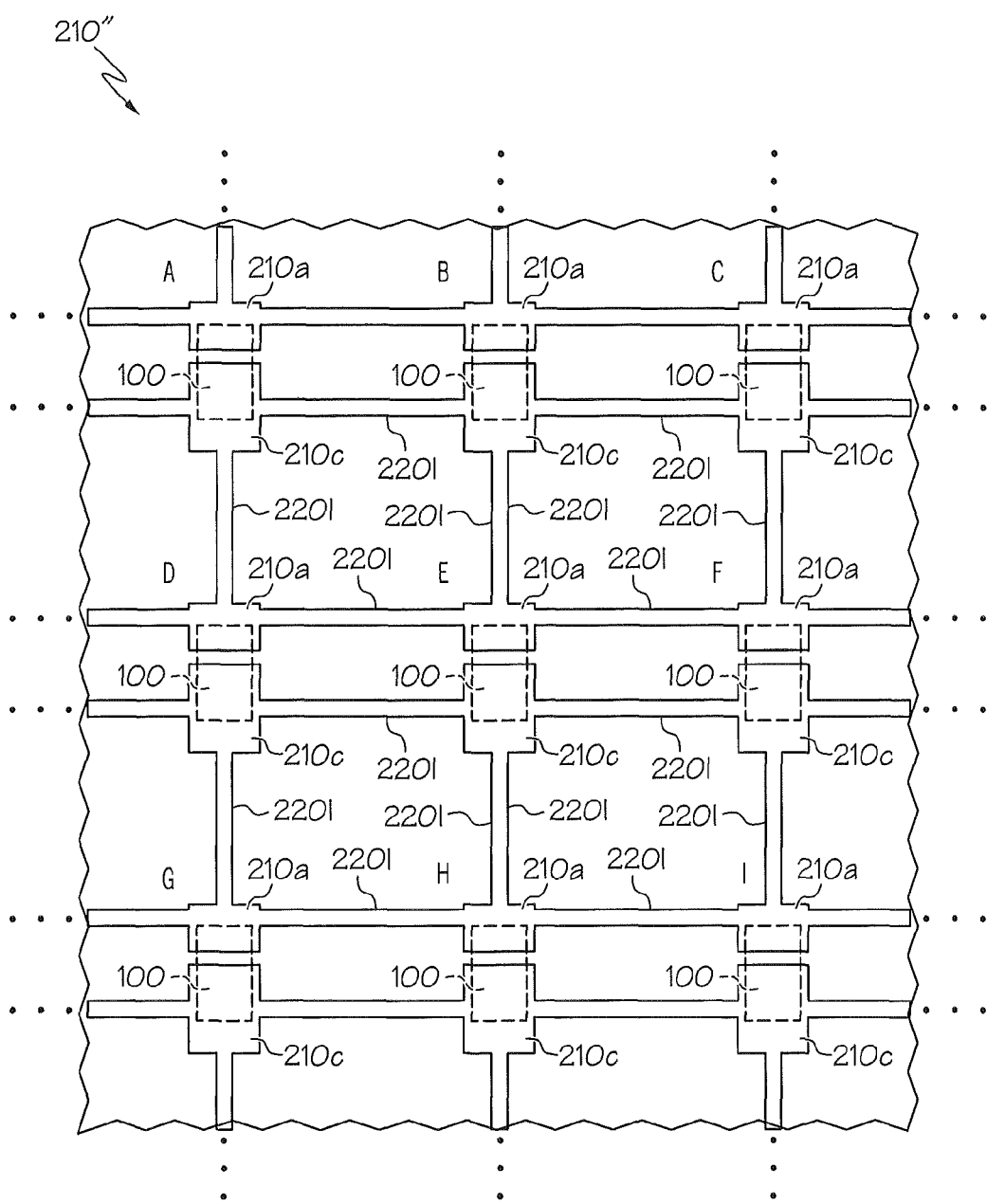
FIG. 14 is a bottom plan view of a contact expansion frame with a plurality of LED dies mounted thereon according to various embodiments described herein.

FIG. 14 is a bottom plan view of a plurality of LED components that may be fabricated on a single expansion frame according to various embodiments described herein. As shown in FIG. 14, the expansion frame 210" includes an array of pairs A-I of closely spaced apart expanded anode contacts 210a and expanded cathode contacts 210c and a linking portion 2101 that selectively electrically connects the expanded anode and/or cathode contacts of adjacent pairs A-I to one another. The LED dies 100 are illustrated in FIG. 14 in dashed form, and the anode and cathode contacts thereof and the connection of a respective anode and cathode to a respective expanded anode contact and a respective expanded cathode contact are not shown for simplicity.

The selective interconnection of expanded anode contacts 210a and expanded cathode contacts 210c by the linking portions 2101 may be described as follows. Referring to the pair of closely spaced apart expanded anode contact 210a and the expanded cathode contact 210c designated by E, the expanded anode contact 210a is electrically connected to the expanded anode contact 210a from pair D on a first side (for example, the left side) of the pair E and is also electrically connected to the expanded anode contact 210a in pair F on a second side (for example, the right side) of pair E. The expanded anode contact 210a of the pair E is also electrically connected by the linking portion 2101 to the expanded cathode contact 210c of pair B that is adjacent to a third side (upward in FIG. 14). As to the expanded cathode contact 210c of the pair E, the linking portion 2101 electrically connects this cathode contact to the cathode contact at a first side (the left side—pair D), to a second cathode contact on a second side (the right side—pair F), and to an anode contact 210a on a third side (the pair below—pair H).

Figure 15:
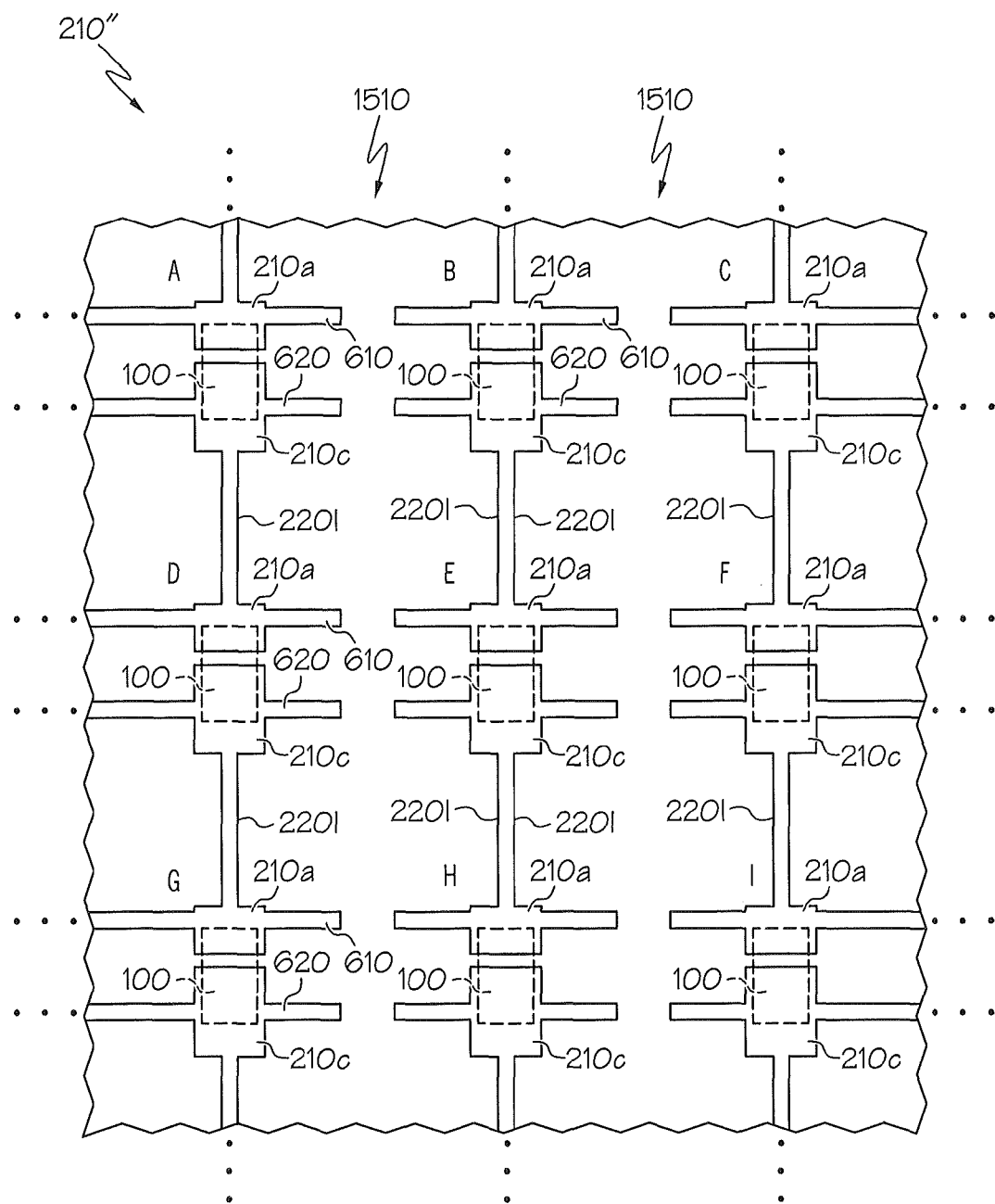
FIG. 15 is a bottom plan view of an expansion frame that is singulated to produce LED components having LED dies that are connected in series according to various embodiments described herein.

By using the expansion frame 210" of FIG. 14, all of the LED dies can be mounted in the same orientation, and singulation of the expansion frame 210" may then take place to produce series and/or parallel connected LED components. More specifically, FIG. 15 illustrates that the columns in the array may be singulated along the direction of the arrows 1510 to produce a plurality of serially connected LED dies. In contrast, in FIG. 16 singulation may be performed along the rows as shown by arrows 1610 to provide a plurality of parallel connected LED dies. It should also be noted that the singulated linking portions 2101 form the tabs 610-620 that were illustrated and described above.

Figure 16:
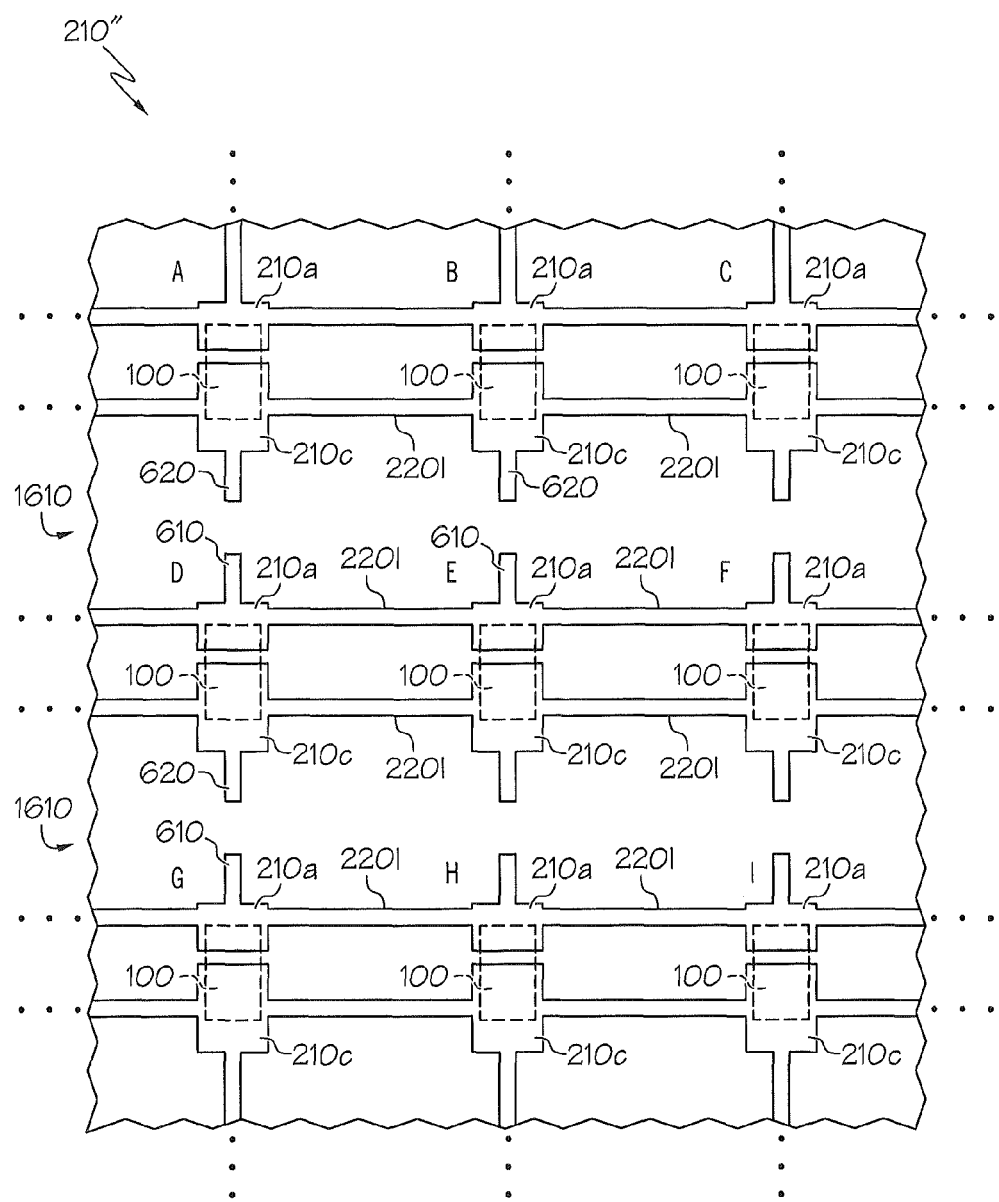
FIG. 16 is a bottom plan view of an expansion frame that is singulated to produce LED components having LED dies that are connected in parallel according to various embodiments described herein.
Figure 17:
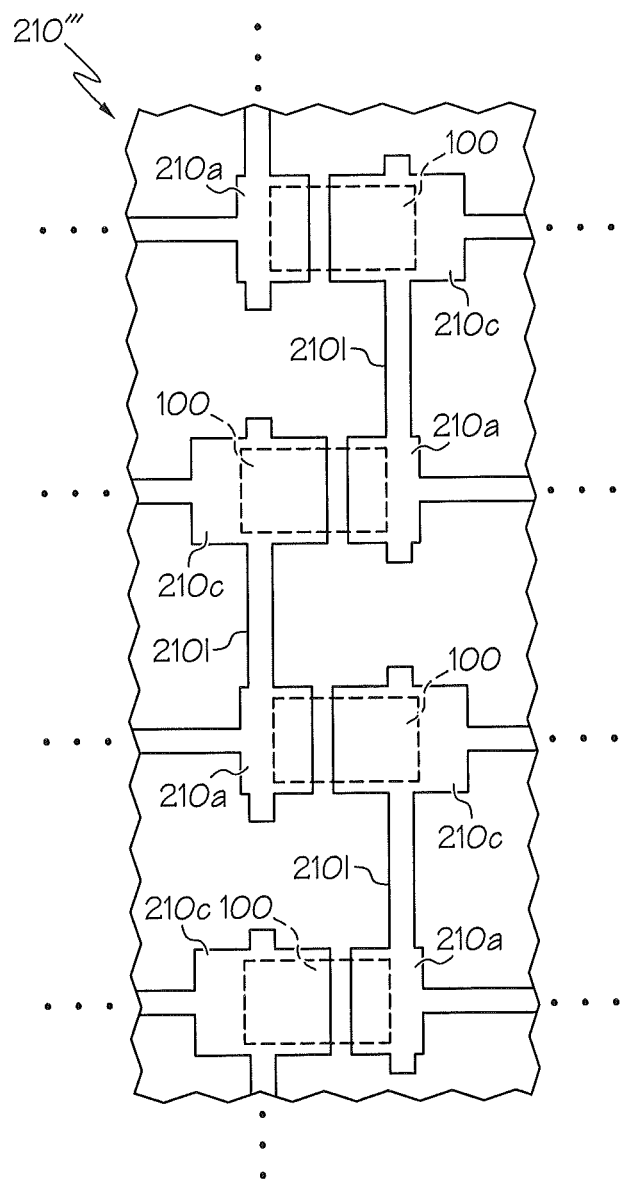
FIG. 17 is a bottom plan view of a contact expansion frame including LED dies mounted thereon according to various other embodiments described herein.

FIG. 17 is a bottom plan view of a contact expansion frame having multiple die LED components according to various other embodiments described herein. In these embodiments a different arrangement is provided for the expansion frame 210''' compared to FIGS. 14-16. Moreover, in these embodiments, in a given column the LED dies 100 are mounted in alternating fashion. The arrangement illustrated in FIG. 17 can be provided for series connections of LED dies but may not facilitate parallel connections of LED dies. Other arrangements of an expansion frame may be used to provide parallel connections of LED dies rather than serial connections of LED dies.

It will also be understood that given expansion frame 200-210''' need not be the same throughout an array. Thus, different portions of the expansion frame may be arranged differently depending on the particular configuration of an LED component that is desired. Moreover, singulation need not take place in the same manner across the entire array. Thus, for a given array, part of the array may be singulated to provide series connections, other parts of the array may be singulated to provide parallel connections and/or other parts of the array may be singulated to provide an LED component that includes both serial and parallel connections of LED dies. Yet other parts may be singulated to provide single die components.

Figure 18:
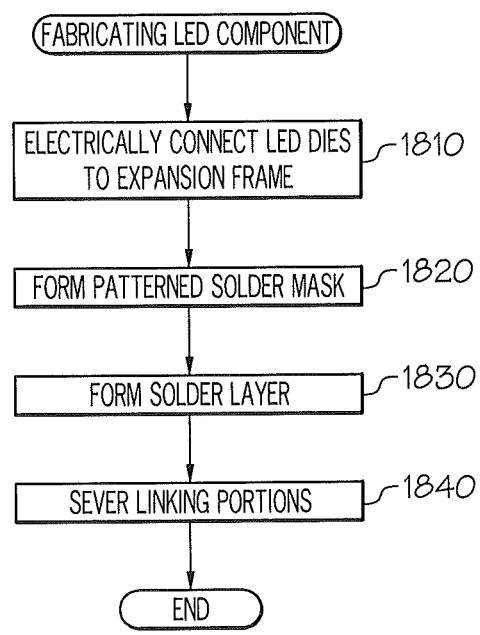
FIG. 18-20 are flowcharts of operations that may be performed to fabricate LED components according to various embodiments described herein.

FIG. 18 is a flowchart of operations that may be performed to fabricate an LED component according to various embodiments described herein. Referring to FIG. 18, at Block 1810 a plurality of discrete LED dies are electrically connected to an expansion frame. As has been described extensively above, the discrete LED dies 100 comprise first 110a and second 120b opposing faces and an anode contact 160 and a cathode contact 170 on the first face 110a thereof. The anode and cathode contacts include outer faces remote from the LED dies 100. Moreover, as was extensively described above, the expansion frame 210''-210''' may comprise an array of pairs A-I of closely spaced apart expanded anode contacts 210a and expanded cathode contacts 210c and the linking portion 2101 that selectively electrically connects the expanded anode and/or cathode contacts of adjacent pairs to one another.

The electrical connection of Block 1810 is performed such that a respective anode contact 160 of a respective LED die 110 faces and is electrically connected to a respective expanded anode contact 210a of a respective closely spaced apart pair A-I, and a respective cathode contact 170 of a respective LED die 100 faces and is electrically connected to a respective expanded cathode contact 210c of the respective closely spaced apart pair A-I. Moreover, as was described extensively above, a respective expanded anode contact 210a extends along the outer face of a respective anode contact 160 and beyond the respective anode contact 160. Moreover a respected expanded cathode contact 210c extends along the outer face of a respective cathode contact 170 and beyond the respective cathode contact 170.

In some embodiments, the electrical connecting of Block 1810 comprises soldering the LED dies to the expansion frame 210'', for example using the solder layer 240.

Referring back to FIG. 18, at Block 1820 a patterned solder mask 220 is formed on the expansion frame 210 remote from the anode and cathode contacts 160 and 170 respectively. The patterned solder mask 220 exposes a portion of the outer faces 210o of the expanded anode contacts 210a and a portion of the outer faces 210o of the expanded cathode contacts 210c.

Referring again to FIG. 18, at Block 1830 a solder layer 230 is formed on the exposed portions of the outer face of the expanded anode contacts 210a and/or on the exposed portions of the outer face 210o of the expanded cathode contacts 210c. In other embodiments, the solder layer may be formed (Block 1830) before forming the patterned solder mask (Block 1820).

Finally, at Block 1840, at least some of the linking portions are severed as was illustrated for example in FIGS. 15 and 16, to singulate the plurality of LED components. In some embodiments the severing may take place to singulate single die LED components. Moreover in other embodiments the singulating may take place to singulate multiple die LED components, the LED dies of which are connected in series and/or in parallel as was illustrated for example in FIGS. 15 and 16. As was also noted, in a given expansion frame multiple types of singulating may take place to produce multiple types of LED components.

Figure 19:
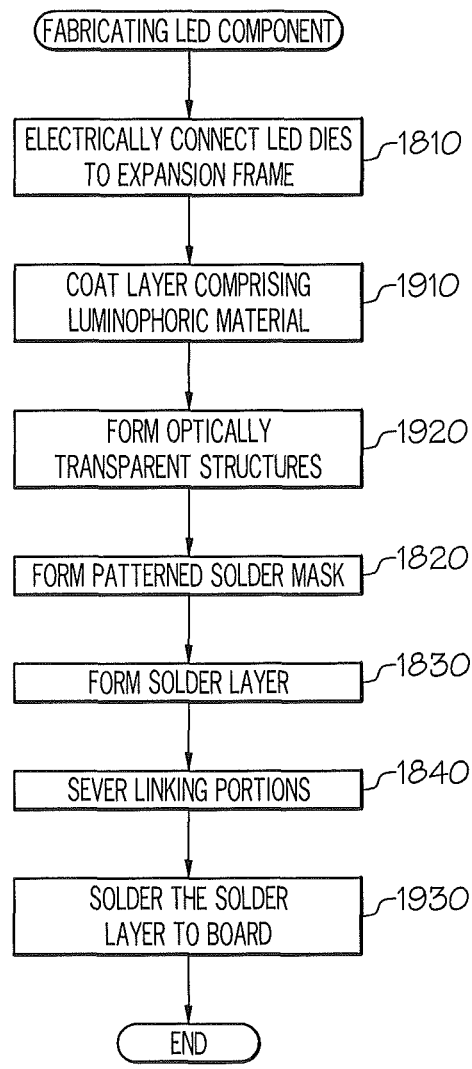

FIG. 19 is a flowchart of operations that may be performed to fabricate a plurality of LED components according to various other embodiments described herein. Referring to FIG. 19, the operations of Block 1810 are performed. Then, at Block 1910, a layer 510 comprising luminophoric material is coated on the second face 120b of the LED dies 100 and extending onto sidewalls of the LED dies 100 and onto an inner face of the expansion frame 210 that is adjacent the anode and cathode contacts, as was described above in connection with FIGS. 5 and 9. At Block 1920, optically transparent structures 520 are formed on the layer 510 comprising luminophoric material, remote from the LED dies 100 as was described for example in connection with FIGS. 5, 10 and 11.

Still referring to FIG. 19, the operations of Blocks 1820, 1830 and 1840 are performed. As was noted above, in some embodiments, the solder layer may be formed (Block 1830) before forming the patterned solder mask (Block 1820). Finally, at Block 1930 the solder layer is soldered to a board along with other electronic components without a submount between the solder layer and the board, as was described for example in connection with FIGS. 7 and 13.

Figure 20:
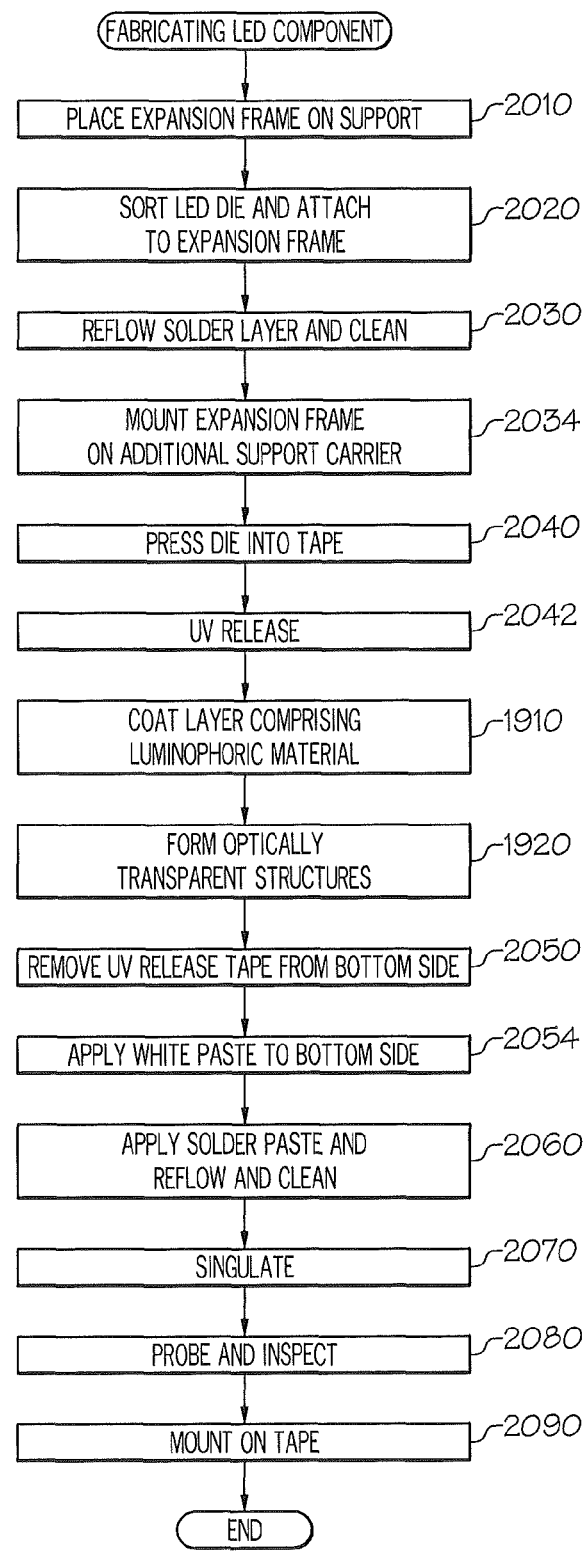

FIG. 20 is a flowchart of operations that may be performed to fabricate an LED component according to various other embodiments described herein. Referring to FIG. 20, at Block 2010 the expansion frame 210 is placed on a support. In some embodiments the support may be embodied as a multilayer carrier sheet, including a bottom rigid layer, a Thermal Release (TR) intermediate layer, and a top ultraviolet curable layer as was described in the above-cited U.S. patent application Ser. No. 14/289,305.

At Block 2020, a plurality of LED dies 100 are fabricated, for example in a semiconductor wafer, and are then singulated, binned and sorted. A group of binned and sorted discrete LED dies 100 are then placed on the expansion frame 210 opposite the support, using for example pick and place techniques. Flux may also be applied as needed. At Block 2030, the solder layer 240 is reflowed and cleaned if needed to remove the flux. It will be understood that the operations of Blocks 2020 and 2030 may provide an embodiment of the operations of Block 1810.

At Block 2034, the expansion frame 210 is optionally removed from the support carrier and mounted on a different support carrier. However, the original support from Block 2010 may be used in other embodiments. At Block 2040, the die are pressed into the tape so that they are "equivalently located" with respect to the bottom plane, so that stencil and/or screen printing may be employed during subsequent processing. Specifically, contact printing may require a level contact surface for uniform results. At Block 2042, the top ultraviolet curable layer of the support is cured to release the layer. Specifically, the operations at Block 2042 may allow easy removal of the tape from the contact expansion frame, so as not to distort the die position or pull material from the component buildup. It is desirable to maintain low distortion for accurate contact printing in an array format.

Continuing with the description of FIG. 20, the operations of Block 1910 are then performed. The layer comprising luminophoric material may be cured if needed. Then, the operations of Block 1920 are performed, for example by applying silicone and a glass top to the top side of the dies. The silicone may be cured if needed.

At Block 2050, the UV release tape is removed using thermal energy to melt the thermal release intermediate layer. Specifically, the thermal release adhesive is used to hold the UV tape backing. Applying heat will release the UV tape, which has already had the UV adhesive released from the contact expansion frame. At this stage, after thermal release, the UV tape can be easily peeled from the contact expansion frame. At Block 2054, a solder mask 220 such as white paint is applied to the bottom side and is cured if needed. In some embodiments, the solder mask or white paint is generally about 50 µm thick. Block 2054 may provide an embodiment of Block 1820 of FIGS. 18 and 19.

At Block 2060 solder paste is applied and is then reflowed and cleaned if needed which may provide an embodiment of Block 1830 of FIGS. 18 and 19. In some embodiments, the operations of Block 2060 may be performed prior to the operations of Block 2054. Singulation is then performed at Block 2070 which may provide an embodiment of Block 1840 of FIGS. 18 and 19. Probing and inspection may then take place at Block 2080. The LED components may then be mounted on a tape at Block 2090 for delivery to surface mount technology factories.

Figure 21A:
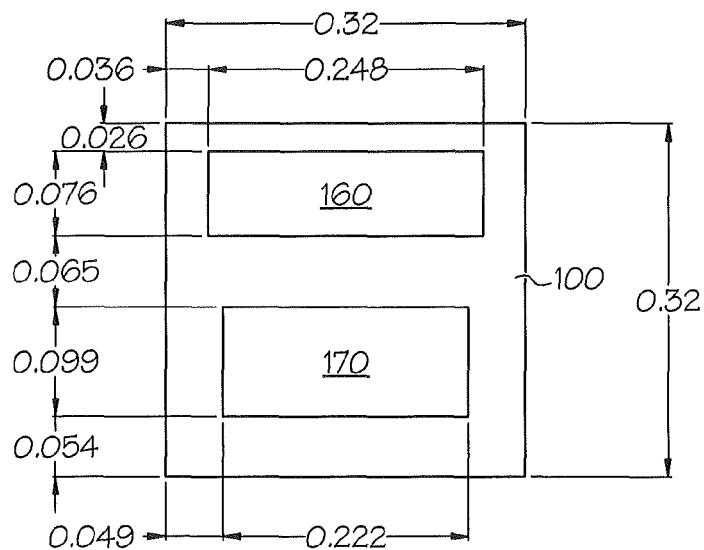
FIG. 21A is a plan view of an example of an LED die with dimensions.

FIG. 21A is a top plan view of an LED die 100 that may be used with various embodiments described herein. The LED die 100 may be embodied as a DA3232 die manufactured by Cree, Inc., the Assignee of the present application. The dimensions thereof are indicated in mm.

Figure 21B:
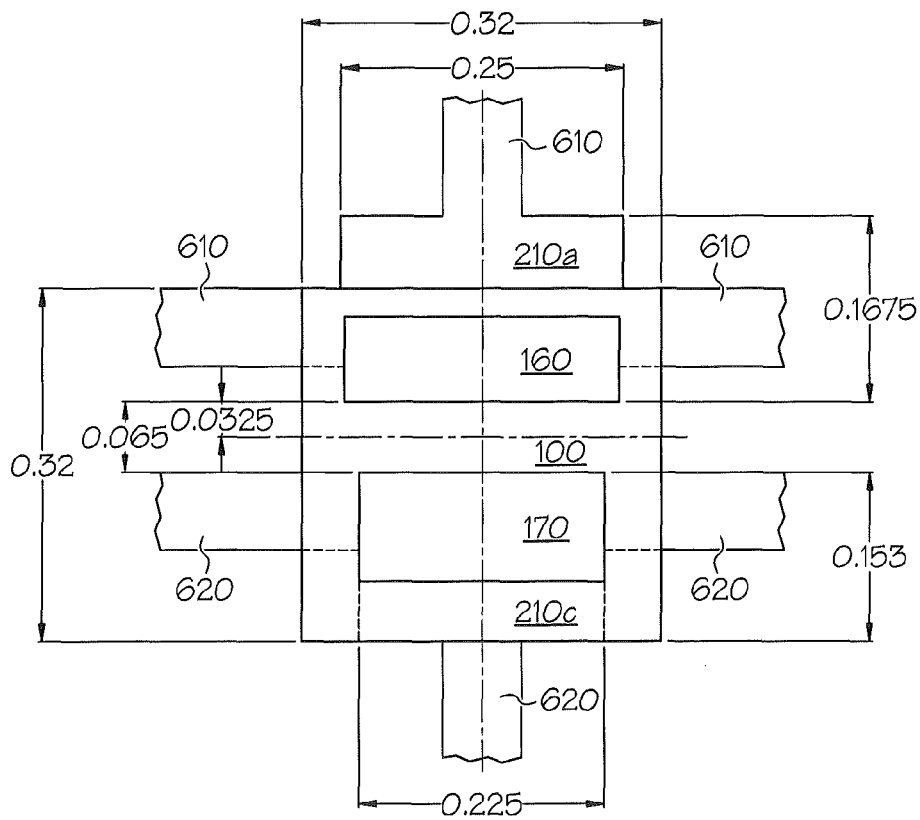
FIG. 21B is an example, with dimensions, of a pair of closely spaced apart expanded anode and cathode contacts with the LED die of FIG. 21A mounted thereon according to various embodiments described herein.

Moreover, FIG. 21B illustrates the LED die 100 of FIG. 21A mounted on one of the pairs A-I of closely spaced apart expanded anode contacts 210a and expanded cathode contacts 210c as was illustrated, for example in FIGS. 14-16. Dimensions in mm are provided.

Additional discussion of LED components according to various embodiments described herein will now be provided.

Specifically, various embodiments described herein can allow the use of multiple small dies with spacing, which can be advantageous over larger dies in light output due to less self-absorption by the LED dies. Small dies may also be less costly than larger dies, due to higher die-per-wafer yield. The tradeoff may be more placements and interconnects, but these may be almost free with modern manufacturing techniques. Multiple small dies can be used in low voltage applications, or can be structured together to form higher voltage components. Multiple small dies may be used to form one component without a submount. This can provide increased area for better thermal dissipation compared to a single die solution, which can provide less thermal roll-off of luminous flux. Specifically, thermal management may be better as heat sources may be distributed rather than being concentrated or crowded. Moreover, thermal management may be better as connecting substrate pads may be made larger with better heat conduction possible. Finally, an increase in luminous flux may be provided due to less self-absorption compared to a single die.

In other embodiments, a single multi-die component may be used for multiple voltages or staged turn-on within a component. Moreover, since no submount is required, cost and/or reliability may be increased. The increase in die perimeter area compared to a single die can correlate to efficiency gain. It will also be understood that various embodiments described herein may require more accurate placement of a component on a board, because the component may be larger. Moreover, handling this larger component may be mitigated using existing multiple ejector pin arrangements that can eject a large component from a carrier sheet.

Various embodiments described herein can also merge white paint processing with an existing Direct Attach (DA) LED die. Wafer level white paint processing previously required special die fabrication which may add two photolithography levels to the build sequence and which may make the die too expensive to be incorporated into existing projects. In contrast, various embodiments described herein may allow existing 5 or 6 level DA die to be processed without a substrate or submount, which can save cost, and in a matrix format similar to wafer level processing. A basic lead frame may be used and the white paint processing can immediately save 3% of light by eliminating the need for gel. Flexible arrangements are also possible ranging from single components to series and/or parallel in one array. Alternative embodiments, such as creative or artistic designs also may be provided as lead frame manufacturing and etching is cheap, and may even be available in home kits. Other embodiments such as clothing enhancement and flexible components may be provided.

Accordingly, various embodiments described herein need not provide extra photolithography levels, but rather can use an existing DA die. Moreover, lead frames such as the contact expansion frame, without molding, can be very cheap and accurate. Low cost LED components may thereby be provided which can eliminate the substrate, and can use white paint for enhanced brightness. Smaller die may be used which may be lower cost and efficient. Moreover, the contact expansion frame can reduce issues of shrinkage during curing without the need to provide a glass top. In other embodiments, a glass sheet may be used for brightness and robustness but at a potential tradeoff of singulation. Finally, gel may not be required which can provide a 3% boost in light output automatically.

It will also be understood, however, that the single or multiple die components according to various embodiments described herein, may not be as robust as components that use a ceramic interposer. As such, they may require advanced care in handling, which may be difficult for some SMT fabrication plants. Finally, small areas of exposed contact expansion frame may be produced due to singulation. If the contact expansion frame comprises copper, this may cause oxidation and may cause the small exposed areas of copper to turn green. This may be a common occurrence in other lead frame products, and need not impact performance.

Various embodiments described herein can utilize a solder mask layer. These solder mask layers can include a dielectric mirror, a white paint reflective layer, such as a titania-filled layer, and/or other white/reflective layer. Many different reflectors can be used including a mirror layer comprising silver, diffuse reflectors, materials comprising a reflective white color, and thin film reflectors, such as metal or dielectric layers. The reflective layer may have various thicknesses, including some which do not exceed the thickness of the anode and cathode contacts. The reflective layer shown may also extend between the anode and cathode contacts. In embodiments where the reflective layer exceeds the height of the anode and cathode contacts, it may be desirable to generate a contact with enough material to overcome the height barrier of the reflective layer and also to have a balanced amount of material on both contact pads so that uniform attachment is achieved.

A solder mask may comprise any material that is generally used in microelectronic manufacturing to physically and electrically insulate those portions of the circuit to which no solder or soldering is desired. Solder masks may include thermally cured screen-printed masks, dry film and/or screen-applied or curtain-coated liquid photoimageable solder masks. In some embodiments, the solder mask may comprise a conventional photoresist, or any other material that is non-wettable to solder. A solder mask may be less than about 30 μm thick in some embodiments, less than about 5 μm thick in other embodiments, and may be about 1 μm thick or less in still other embodiments. A wide range of thicknesses and materials may be used, as long as effective solder masking takes place. Moreover, in other embodiments, the solder mask may also include virtually any non-metallic coating, such as silicon dioxide and/or silicon nitride, which may be deposited by physical and/or chemical deposition techniques. In still other embodiments, the solder mask may be reflective, so as to reflect optical radiation that emerges from the diode region, back into the diode region. Examples of such reflective layers include a dielectric mirror, a white reflective layer, such as a titania-filled layer, and/or other white/reflective layer.

Various embodiments described herein may also include a layer comprising luminophoric material, also referred to as a phosphor layer. The phosphor layer may also extend onto the sidewalls of the diode dies, and/or beyond the anode and cathode contacts. In some embodiments, the phosphor layer is a conformal phosphor layer that may be less than about 150 μm thick in some embodiments, less than about 100 μm thick in other embodiments and less than about 50 μm thick in yet other embodiments. It will be understood that the term "phosphor" is used herein to denote any wavelength conversion material, and may be provided according to various configurations. The phosphor layer may also be any type of functional layer or layers, such as any layer disposed to affect the properties of the emitted light, for example, color, intensity and/or direction.

Various techniques may be used to apply the phosphor layer, including dispensing, screen printing, film transfer, spraying, coating and/or other techniques. Phosphor preforms also may be applied. In some embodiments, the phosphor layer may comprise silicone and/or other transparent material having phosphor particles therein. It will also be understood that the phosphor layer may be coplanar with the outer face of the LED dies. However, the outer or edge portions of the phosphor layer need not be co-planar with these outer faces. Specifically, it can be recessed from the outer faces or may protrude beyond the anode and cathode contacts.

The phosphor layer may be a thin conformal layer having uniform phosphor particle density. However, a phosphor layer may be provided that comprises phosphor particles that are nonuniformly dispersed therein, and that, in some embodiments, may include a phosphor-free region at the exterior surfaces of the phosphor layer. Moreover, the phosphor layer may also be configured as a conformal layer.

The phosphor layer, or any wavelength conversion layer, converts a portion of the light emitted from the LED die to a different wavelength, a process that is known in the art. One example of this process, is converting a portion of blue-emitted light from light emitter, such as an LED die, to yellow light. Yttrium aluminum garnet (YAG) is an example of a common phosphor that may be used.

In some embodiments, the phosphor particles comprise many different compositions and phosphor materials alone or in combination. In one embodiment the single crystalline phosphor can comprise yttrium aluminum garnet (YAG, with chemical formula $Y_3Al_5O_{12}$). The YAG host can be combined with other compounds to achieve the desired emission wavelength. In one embodiment where the single crystalline phosphor absorbs blue light and reemits yellow, the single crystalline phosphor can comprise YAG:Ce. This embodiment is particularly applicable to light emitters that emit a white light combination of blue and yellow light. A full range of broad yellow spectral emission is possible using conversion particles made of phosphors based on the $(Gd,Y)_3(Al,Ga)_5O_{12}$:Ce system, which include $Y_3Al_5O_{12}$:Ce (YAG). Other yellow phosphors that can be used for white emitting LED chips include:

$Tb_{3-x}Re_xO_{12}$:Ce (TAG);
RE=Y, Gd, La, Lu; and/or
$Sr_{2-x-y}Ba_xCa_ySiO_4$:Eu.

In other embodiments, other compounds can be used with a YAG host for absorption and re-emission of different wavelengths of light. For example, a YAG:Nb single crystal phosphor can be provided to absorb blue light and reemit red light. First and second phosphors can also be combined for higher CRI white (i.e., warm white) with the yellow phosphors above combined with red phosphors. Various red phosphors can be used including:

$Sr_xCa_{1-x}S$:Eu,Y; Y=halide;
$CaSiAlN_3$:Eu; or
$Sr_{2-y}Ca_ySiO_4$:Eu.

Other phosphors can be used to create saturated color emission by converting substantially all light to a particular color. For example, the following phosphors can be used to generate great saturated light:

$SrGa_2S_4$:Eu;
$Sr_{2-y}Ba_ySiO_4$:Eu; or
$SrSi_2O_2N_2$:Eu.

The following lists some additional suitable phosphors that can be used as conversion particles, although others can be used. Each exhibits excitation in the blue and/or UV emission spectrum, provides a desirable peak emission, has efficient light conversion:

Yellow/Green
$(Sr,Ca,Ba)(Al,Ga)_2S_4$:$Eu^{2+}$
$Ba_2(Mg,Zn)Si_2O_7$:$Eu^{2+}$
$Gd_{0.46}Sr_{0.31}Al_{1.23}O_xF_{1.38}$:$Eu^{2+}_{0.6}$
$(Ba_{1-x-y}Sr_xCa_y)SiO_4$:Eu
$Ba_2SiO_4$=$Eu^{2+}$ Red
$Lu_2O_3$=$Eu^{3+}$
$(Sr_{2-x}La_x)(Ce_{1-x}Eu_x)O_4$
$ST_2C_{1-x}Eu_xO_4$
$SrTiO_3$:$Pr^{3+}$, $GA^{3+}$
$CaAlSiN_3$I$Eu^{2+}$
$Sr_2Si_5N_8$=$Eu^{2+}$ In some embodiments, the layer comprising luminophoric material, the optical coupling layer and/or the optically transparent structure may also provide a functional layer which comprises a light scattering layer, which comprises a binder material as discussed above and light scattering particles, for example titanium oxide particles. In other embodiments, the layer comprises materials to alter the refractive index of the functional layer. In some embodiments, the functional layer comprises a combination of one or more of the types of functional layers described herein (e.g. a wavelength conversion layer and a scattering or refractive index altering layer).

In some embodiments, the LED die is configured to emit blue light, for example light having a dominant wavelength of about 450-460 nm, and the phosphor layer comprises yellow phosphor, such as YAG:Ce phosphor, having a peak wavelength of about 550 nm. In other embodiments, the LED die is configured to emit blue light upon energization thereof, and the phosphor layer may comprise a mixture of yellow phosphor and red phosphor, such CASN-based phosphor. In still other embodiments, the LED die is configured to emit blue light upon energization thereof, and the phosphor layer may comprise a mixture of yellow phosphor, red phosphor and green phosphor, such as LuAG: Ce phosphor particles. Moreover, various combinations and subcombinations of these and/or other colors and/or types of phosphors may be used in mixtures and/or in separate layers. In still other embodiments, a phosphor layer is not used. For example, a blue, green, amber, red, etc., LED need not use phosphor. In embodiments which do use a phosphor, it may be beneficial to provide a uniform coating in order to provide more uniform emissions.

The optical coupling material may comprise silicone without phosphor particles therein, and may provide a primary optic for the light emitting device. The optical coupling material that is free of phosphor may be shaped to provide a lens, dome and/or other optical component, so that the sides and/or tops thereof may be oblique to the diode region. The optical coupling material that is free of phosphor may also encapsulate the phosphor layer and/or light emitting surfaces of the LED die. The optical coupling layer may be at least 1.5 mm thick in some embodiments, at least 0.5 mm thick in other embodiments, and at least 0.01 mm thick in yet other embodiments, and may not be present in still other embodiments. Thus, in other embodiments, an optical coupling material layer may be used without a phosphor layer. For example, the optical coupling material may be directly on the second face of the LED die. In some embodiments, a relatively thick transparent layer may be used. In other embodiments, a conformal transparent layer may be used. In still other embodiments, the transparent layer may be provided on a phosphor layer that comprises phosphor particles that are non-uniformly dispersed therein. The device may further include an additional encapsulant or lens, which may be silicone or glass. Other embodiments may not include this additional lens.

Various embodiments described herein may also include a board, such as a printed circuit board. The printed circuit board may include any conventional circuit board material that is used to mechanically support and electrically connect electronic components using conductive pathways, tracks or signal traces. The printed circuit board may comprise laminate, copper-clad laminates, resin-impregnated B-stage cloth, copper foil, metal clad printed circuit boards and/or other conventional printed circuit boards. In some embodiments, the printed circuit board is used for surface mounting of electronic components thereon. The printed circuit board may include multiple LED components and any other device thereon, as well as one or more integrated circuit chip power supplies, integrated circuit chip LED controllers and/or other discrete and/or integrated circuit passive and/or active microelectronic components, such as surface mount components thereon.

Various embodiments of luminophoric layers comprising phosphor, optical coupling material, reflective layers and boards, are described, for example, in the above incorporated U.S. patent application Ser. No. 14/289,305 and in U.S. patent application Ser. No. 14/152,829 to Bhat et al. entitled "Wafer Level Contact Pad Solder Bumping for Surface Mount Devices With Non-Planar Recessed Contacting Surfaces", U.S. patent application Ser. No. 14/201,490 to Bhat et al. entitled "Wafer Level Contact Pad Standoffs With Integrated Reflector", and U.S. patent application Ser. No. 13/017,845 to Donofrio et al. entitled "Conformally Coated Light Emitting Devices and Methods for Providing the Same", assigned to the assignee of the present application, the disclosures of which are hereby incorporated herein by reference in their entirety as if set forth fully herein.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed, to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A Light Emitting Diode (LED) component comprising:
an LED die that comprises first and second opposing faces and an anode contact and/or a cathode contact on the first face thereof, the anode and cathode contacts including outer faces remote from the LED die;
a contact expansion frame that comprises an expanded anode contact that is electrically connected to the anode contact remote from the LED die and/or an expanded cathode contact that is electrically connected to the cathode contact remote from the LED die, the expanded anode contact extending along the outer face of the anode contact and beyond the anode contact, the expanded cathode contact extending along the outer face of the cathode contact and beyond the cathode contact, the expanded anode and cathode contacts including outer faces remote from the anode and cathode contacts, the outer faces of the expanded anode and cathode contacts extending along a given direction;
a patterned solder mask on the outer face of the contact expansion frame remote from the anode and cathode contacts, the patterned solder mask exposing a first portion of the outer face of the expanded anode contact and/or a first portion of the outer face of the expanded cathode contact, the patterned solder mask extending on a second portion of the outer face of the expanded anode contact and/or a second portion of the outer face of the expanded cathode contact along the given direction, the first and second portions being offset from one another along the given direction; and
a solder layer on the first portion of the outer face of the expanded anode contact and/or on the first portion of the outer face of the expanded cathode contact.

2. An LED component according to claim 1 wherein the patterned solder mask comprises reflective material.

3. An LED component according to claim 2 wherein the reflective material comprises white paint.

4. An LED component according to claim 1 wherein the contact expansion frame further comprises a first tab, a second tab and a third tab, a respective one of which is adjacent, and extends away from a respective different side of the expanded anode contact and/or a fourth tab, a fifth tab and a sixth tab, a respective one of which is adjacent, and extends away from a respective different side of the expanded cathode contact, the respective first, second and third tabs and the respective fourth, fifth and sixth tabs forming respective unitary conductive structures with the respective expanded anode contact and expanded cathode contact.

5. An LED component according to claim 1 wherein the solder layer is a first solder layer, the LED component further comprising a second solder layer that electrically connects the expanded anode contact to the anode contact remote from the LED die and that electrically connects the expanded cathode contact to the cathode contact remote from the LED die.

6. An LED component according to claim 1 further comprising:
a layer comprising luminophoric material on the second face of the LED die and extending onto sidewalls of the LED die and onto inner faces of the expanded anode and cathode contacts that are opposite the outer faces thereof.

7. An LED component according to claim 6 further comprising:
an optically transparent structure on the layer comprising luminophoric material, remote from the LED die.

8. An LED component according to claim 1 on a board along with other electronic components, wherein the LED component is free of a submount between the LED die and the board.

9. An LED component according to claim 1 further comprising a first wire bond that electrically connects the anode contact to the expanded anode contact and/or a second wire bond that electrically connects the cathode contact to the expanded cathode contact.

10. An LED component according to claim 1 further comprising an encapsulation layer on the LED die and on the contact expansion frame that does not extend on the outer face of the expanded anode contact or on the other face of the expanded cathode contact.

11. An LED component according to claim 1 wherein the anode contact and the cathode contact are on the first face of the LED die.

12. An LED component according to claim 1 wherein only one of the anode contact or the cathode contact is on the first face of the LED die.

13. A Light Emitting Diode (LED) component comprising:
a first LED die that comprises first and second opposing faces and a first anode contact and a first cathode contact on the first face thereof, the first anode and cathode contacts including outer faces remote from the first LED die;
a second LED die that comprises first and second opposing faces and a second anode contact and a second cathode contact on the first face thereof, the second anode and cathode contacts including outer faces remote from the second LED die;
a contact expansion frame that comprises a first expanded anode contact that is electrically connected to the first anode contact remote from the first LED die and a first expanded cathode contact that is electrically connected to the first cathode contact remote from the first LED die, the first expanded anode contact extending along the outer face of the first anode contact and beyond the first anode contact, the first expanded cathode contact extending along the outer face of the first cathode contact and beyond the first cathode contact, the first expanded anode and cathode contacts including outer faces remote from the first anode and cathode contacts;
the contact expansion frame further comprising a second expanded anode contact that is electrically connected to the second anode contact remote from the second LED die and an expanded second cathode contact that is electrically connected to the second cathode contact remote from the second LED die, the second expanded anode contact extending along the outer face of the second anode contact and beyond the second anode contact, the second expanded cathode contact extending along the outer face of the second cathode contact and beyond the second cathode contact, the second expanded anode and cathode contacts including outer faces remote from the second anode and cathode contacts;
the contact expansion frame further comprising a linking portion that electrically connects the first expanded cathode contact to the second expanded anode contact or to the second expanded cathode contact, the linking portion forming a unitary conductive structure with the first expanded cathode contact and the second expanded anode contact or the second expanded cathode contact that are connected by the linking portion;
a patterned solder mask on the contact expansion frame remote from the anode and cathode contacts, that exposes a portion of the outer faces of the first and/or second expanded anode contacts and a portion of the outer faces of the first and/or second expanded cathode contacts; and
a solder layer on the portion of the outer faces of the first and/or second expanded anode contacts and/or on the portion of the outer faces of the first and/or second expanded cathode contacts.

14. An LED component according to claim 13 wherein the linking portion electrically connects the first expanded cathode contact to the second expanded anode contact so as to connect the first and second LED dies in series.

15. An LED component according to claim 13 wherein the linking portion electrically connects the first expanded anode contact to the second expanded anode contact and electrically connects the first expanded cathode contact to the second expanded cathode contact so as to connect the first and second LED dies in parallel.

16. An LED component according to claim 13 wherein the patterned solder mask comprises reflective material.

17. An LED component according to claim 16 wherein the reflective material comprises white paint.

18. An LED component according to claim 13 wherein the contact expansion frame further comprises a first tab, a second tab and a third tab, a respective one of which is adjacent, and extends away from a respective different side of the first expanded anode contact and a fourth tab, a fifth tab and a sixth tab, a respective one of which is adjacent, and extends away from a respective different side of the second expanded cathode or anode contacts, the respective first, second and third tabs and the respective fourth, fifth and sixth tabs forming respective unitary conductive structures with the respective first expanded anode contact and second expanded cathode or anode contacts.

19. An LED component according to claim 13 wherein the solder layer is a first solder layer, the LED component further comprising a second solder layer that electrically connects a respective expanded anode contact to a respective anode contact remote from a respective LED die and that electrically connects a respective expanded cathode contact to a respective cathode contact remote from the respective LED die.

20. An LED component according to claim 13 further comprising:
a layer comprising luminophoric material on the second face of the first and second LED dies and extending onto sidewalls of the first and second LED dies and onto inner faces of the first and second expanded anode and cathode contacts that are opposite the inner faces thereof.

21. An LED component according to claim 20 further comprising:
an optically transparent structure on the layer comprising luminophoric material, remote from the first and/or second LED dies.

22. An LED component according to claim 13 on a board along with other electronic components, wherein the LED component is free of a submount between the first and second LED dies and the board.

23. A Light Emitting Diode (LED) component comprising:
an LED die that comprises first and second opposing faces and an anode contact and/or a cathode contact on the first face thereof, the anode and cathode contacts including outer faces remote from the LED die;
a contact expansion frame that comprises an expanded anode contact that is electrically connected to the anode contact remote from the LED die and/or an expanded cathode contact that is electrically connected to the cathode contact remote from the LED die, the expanded anode contact being a unitary metal sheet having an inner face that extends along the outer face of the anode contact and beyond the anode contact, the expanded cathode contact being a unitary metal sheet having an inner face that extends along the outer face of the cathode contact and beyond the cathode contact, the unitary metal sheets of the expanded anode and cathode contacts including outer faces remote from the anode and cathode contacts;
an encapsulation layer on the LED die and on the contact expansion frame that does not extend on the outer face of the expanded anode contact or on the outer face of the expanded cathode contact; and
a solder layer on the outer face of the expanded anode contact and/or on the outer face of the expanded cathode contact.

24. An LED component according to claim 23 wherein the contact expansion frame further comprises a first tab a second tab and a third tab, a respective one of which is adjacent, and extends away from a respective different side of the expanded anode contact and/or a fourth tab, a fifth tab and a sixth tab, a respective one of which is adjacent, and extends away from a respective different side of the expanded cathode contact, the respective first, second and third tabs and the respective fourth, fifth and sixth tabs forming respective unitary conductive structures with the respective expanded anode contact and expanded cathode contact.

25. An LED component according to claim 23 wherein the solder layer is a first solder layer, the LED component further comprising a second solder layer that electrically connects the expanded anode contact to the anode contact remote from the LED die and that electrically connects the expanded cathode contact to the cathode contact remote from the LED die.

26. An LED component according to claim 23 on a board along with other electronic components, wherein the LED component is free of a submount between the LED die and the board.

27. An LED component according to claim 23 further comprising a first wire bond that electrically connects the anode contact to the expanded anode contact and/or a second wire bond that electrically connects the cathode contact to the expanded cathode contact.

28. An LED component according to claim 23 wherein only one of the anode contact or the cathode contact is on the first face of the LED die.

* * * * *

UNITED STATES PATENT AND TRADEMARK OFFICE
CERTIFICATE OF CORRECTION

| | |
|---|---|
| PATENT NO. | : 9,660,161 B2 |
| APPLICATION NO. | : 14/325047 |
| DATED | : May 23, 2017 |
| INVENTOR(S) | : Andrews |

Page 1 of 1

It is certified that error appears in the above-identified patent and that said Letters Patent is hereby corrected as shown below:

In the Specification

Column 22, Line 59: Please correct "$ST_2C_{1-x}Eu_xO_4$" to read -- $Sr_2C_{1-x}Eu_xO_4$ --

Signed and Sealed this
Ninth Day of January, 2018

Joseph Matal
*Performing the Functions and Duties of the*
*Under Secretary of Commerce for Intellectual Property and*
*Director of the United States Patent and Trademark Office*